US010644168B2

(12) United States Patent
Colinge et al.

(10) Patent No.: US 10,644,168 B2
(45) Date of Patent: May 5, 2020

(54) 2-D MATERIAL TRANSISTOR WITH VERTICAL STRUCTURE

(71) Applicant: Taiwan Semiconductor Manufacturing Co., Ltd., Hsinchu (TW)

(72) Inventors: Jean-Pierre Colinge, Hsinchu (TW); Chung-Cheng Wu, Hsin-Chu County (TW); Carlos H. Diaz, Mountain View, CA (US); Chih-Hao Wang, Hsinchu (TW); Ken-Ichi Goto, Hsin-Chu (TW); Ta-Pen Guo, Taipei (TW); Yee-Chia Yeo, Hsinchu (TW); Zhiqiang Wu, Hsinchu (TW); Yu-Ming Lin, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/194,018

(22) Filed: Nov. 16, 2018

(65) Prior Publication Data

US 2019/0103496 A1 Apr. 4, 2019

Related U.S. Application Data

(63) Continuation of application No. 15/615,498, filed on Jun. 6, 2017, now Pat. No. 10,134,915.
(Continued)

(51) Int. Cl.
*H01L 29/786* (2006.01)
*H01L 27/088* (2006.01)
(Continued)

(52) U.S. Cl.
CPC .. *H01L 29/78696* (2013.01); *H01L 21/02521* (2013.01); *H01L 21/02527* (2013.01);
(Continued)

(58) Field of Classification Search
CPC ......... H01L 29/78696; H01L 21/02521; H01L 21/02527; H01L 21/02568; H01L 27/0886;
(Continued)

(56) References Cited

U.S. PATENT DOCUMENTS

| | | | |
|---|---|---|---|
| 9,711,647 | B2 | 7/2017 | van Dal et al. |
| 2009/0020764 | A1 | 1/2009 | Anderson et al. |

(Continued)

FOREIGN PATENT DOCUMENTS

| | | | |
|---|---|---|---|
| CN | 104192835 | A | 12/2014 |
| KR | 20150143267 | | 12/2015 |

OTHER PUBLICATIONS

Office Action, dated Mar. 3, 2020, for Chinese Intellectual Property Office Patent Appl. No. 201710950065.6, 9 pages.

*Primary Examiner* — Feifei Yeung Lopez
(74) *Attorney, Agent, or Firm* — Sterne, Kessler, Goldstein & Fox P.L.L.C.

(57) ABSTRACT

Semiconductor structures including two-dimensional (2-D) materials and methods of manufacture thereof are described. By implementing 2-D materials in transistor gate architectures such as field-effect transistors (FETs), the semiconductor structures in accordance with this disclosure include vertical gate structures and incorporate 2-D materials such as graphene, transition metal dichalcogenides (TMDs), or phosphorene.

20 Claims, 18 Drawing Sheets

Related U.S. Application Data

(60) Provisional application No. 62/434,696, filed on Dec. 15, 2016.

(51) Int. Cl.

| | |
|---|---|
| ***H01L 29/16*** | (2006.01) |
| ***H01L 29/24*** | (2006.01) |
| ***H01L 21/02*** | (2006.01) |
| ***H01L 21/8256*** | (2006.01) |
| ***H01L 21/8238*** | (2006.01) |
| ***H01L 29/78*** | (2006.01) |
| ***H01L 29/66*** | (2006.01) |

(52) U.S. Cl.

CPC .... *H01L 21/02568* (2013.01); *H01L 21/8256* (2013.01); *H01L 21/823821* (2013.01); *H01L 27/0886* (2013.01); *H01L 29/1606* (2013.01); *H01L 29/24* (2013.01); *H01L 29/66* (2013.01); *H01L 29/66545* (2013.01); *H01L 29/66795* (2013.01); *H01L 29/785* (2013.01); *H01L 29/7851* (2013.01)

(58) Field of Classification Search

CPC ......... H01L 29/1606; H01L 21/823821; H01L 29/7851

See application file for complete search history.

(56) References Cited

U.S. PATENT DOCUMENTS

| | | | |
|---|---|---|---|
| 2012/0168723 | A1* | 7/2012 | Park .................... H01L 21/0237 257/29 |
| 2013/0134481 | A1 | 5/2013 | Bhuwalka et al. |
| 2015/0364592 | A1 | 12/2015 | van Dal et al. |
| 2015/0370951 | A1 | 12/2015 | Kawa et al. |
| 2017/0244054 | A1 | 8/2017 | Bangsaruntip et al. |

* cited by examiner

2-D MATERIAL TRANSISTOR WITH VERTICAL STRUCTURE

This application is a Continuation of U.S. Non-Provisional patent application Ser. No. 15/615,498, filed on Jun. 6, 2017 and titled "2-D Material Transistor with Vertical Structure," which claims the benefit of U.S. Provisional Patent Application No. 62/434,696, filed on Dec. 15, 2016 and titled "2-D Material Transistor with Vertical Structure." The entire contents of both applications are incorporated by reference herein in their entireties.

BACKGROUND

Many developments in both semiconductor structures and manufacturing processes have contributed to reducing the size and increasing the performance of integrated circuits. One development in semiconductor structures is the introduction of a transistor structure referred to as a "fin field-effect transistor" (FinFET). FinFET transistors can have advantages over other types of transistors (e.g., planar field-effect transistors) such as, for example, greater channel control, reduced short channel effect, higher packing density and lower subthreshold leakage currents.

Two dimensional (2-D) material layers can be used to form the channel region of FinFETs and other types of transistors.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1:
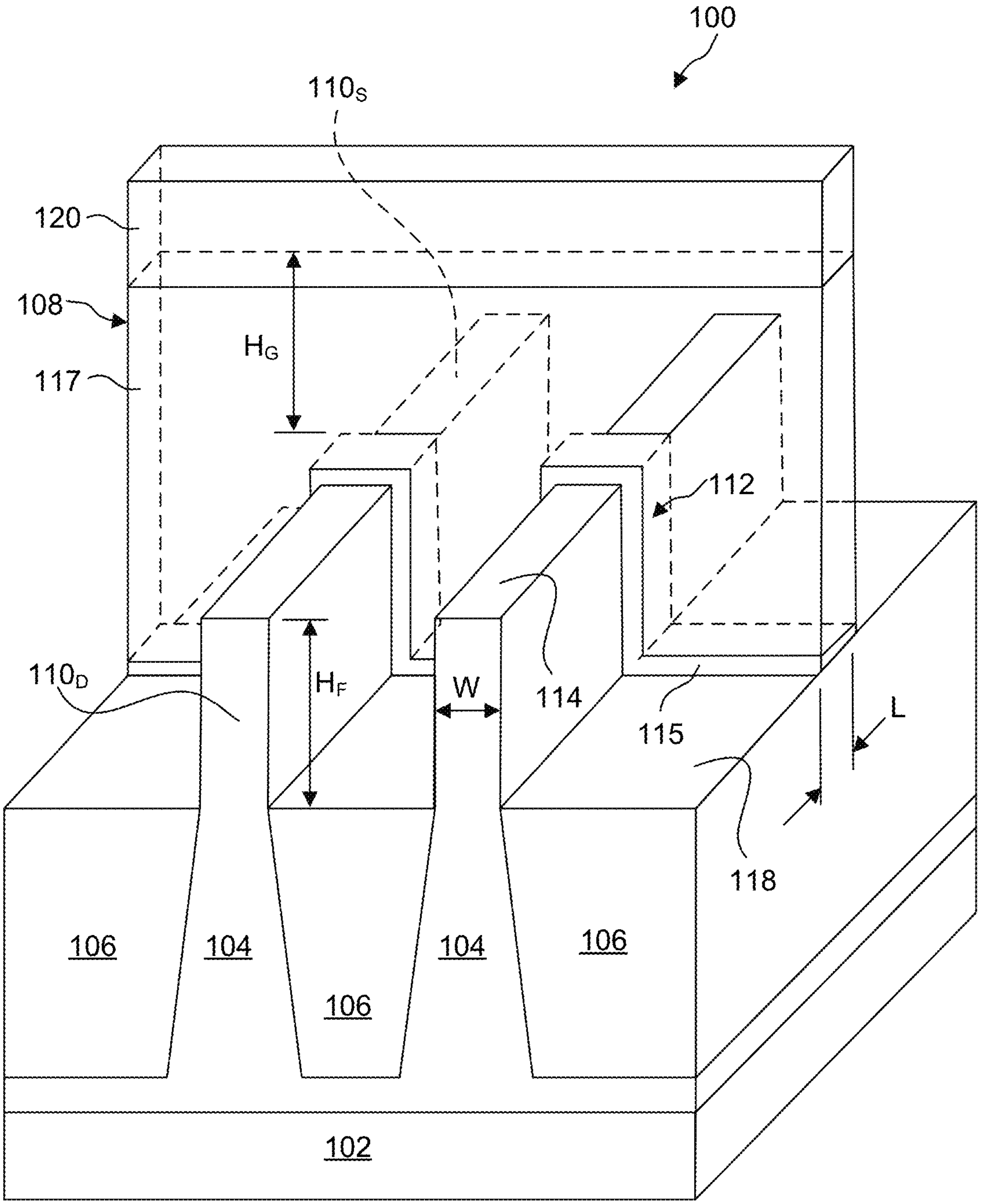
FIG. 1 is an isometric view of an exemplary semiconductor device structure, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym “FET,” as used herein, refers to a field effect transistor. An example of a FET is a metal oxide semiconductor field effect transistor (MOSFET). MOSFETs can be, for example, (i) planar structures built in and on the planar surface of a substrate such as a semiconductor wafer or (ii) built with vertical structures.

The term “FinFET” refers to a FET that is formed over a fin that is vertically oriented with respect to the planar surface of a wafer.

“S/D” refers to the source and/or drain junctions that form two terminals of a FET.

The term “nominal” as used herein refers to a desired, or target, value of a characteristic or parameter for a component or a process operation. A nominal value for the characteristic or parameter can be set during a design phase of a product or a process and can be a range of values above and/or below the desired value. The range of values can be attributed to, for example, variations in manufacturing processes or tolerances.

The term “vertical,” as used herein, means nominally perpendicular to the surface of a substrate.

The expression “epitaxial layer” refers to a layer or structure of single crystal material. Likewise, the expression “epitaxially grown” refers to a layer or structure of single crystal material. Epitaxially-grown material may be doped or undoped.

The performance and scalability of current silicon-based transistors is reaching fundamental limits despite the implementation of various enhancement techniques such as, for example, novel device architectures for enhanced electrostatic control, transport enhancement by strained channels, improved dopant activation, and parasitic resistance reduction. As device dimensions are scaled down to achieve higher packing density, it has been a challenge to shrink silicon-based transistors.

For example, although FinFETs may exhibit improved performance, they are not immune to complications resulting from reduced device size. As the size of a fin structure of the FinFET is reduced, transistor performance is adversely impacted in a number of ways. For example, reductions in body thickness (corresponding to a reduction in fin width) can decrease the mobility of carriers through the channel region. As a consequence, the effective resistance of the channel region increases, resulting in reduced performance.

To maintain electrostatic control of the transistor by the gate and to reduce short-channel effects at short gate lengths, narrower fins may be used. But, at narrow fin widths (e.g., widths below 4-5 nanometers), the mobility of the channel carriers decreases due to surface scattering effects. Another factor that can affect the operation of FinFETs is quantum-mechanical confinement. As would be understood by a person of ordinary skill in the art, as body thickness is reduced, the threshold voltage, $V_{th}$, of the FinFET increases. The threshold voltage is the minimum voltage needed at the gate stack to allow substantial current to flow between the S/D regions. Integrated circuits are typically designed for a particular threshold voltage or voltage range. However, as the body thickness is decreased, the threshold voltage increases; for example, the threshold voltage is proportional to the inverse of the width of the body squared ($1/w^2$). As dimensions of the FinFET decreases and varies between FinFETs, a small change in body thickness along the channel region can increase the discrepancy in respective threshold voltages across the FinFET devices. Thus, variations in threshold voltage between devices become more pronounced.

Therefore, semiconductor-based channel regions with alternative structures are needed to address, among other things, the above manufacturing issues to provide improved carrier mobility, lower body resistance, and consistent device performance.

In some embodiments, two-dimensional (2-D) materials can be implemented to form the alternative structures for the semiconductor-based channel regions. The 2-D materials can be mono-layers of materials held together by chemical bonds and have outstanding electrical and physical properties. Mono-layers can be stacked on each other to form a 2-D material layer that includes individual monolayers. In some embodiments, individual monolayers of graphene, thin layers of black phosphorus (also known as phosphorene), graphene analogues (such as silicene, gemanene, stannene, etc.), and/or boron nitride can be stacked to create the 2-D material layer. Another example of a 2-D material is transition metal dichalcogenides (TMDs). TMDs have a general formula of $MX_2$, where M denotes a transition metal from, for example, periodic table column {IVB, VB, VIB} (e.g., molybdenum (Mo), tungsten (W), niobium (Nb), haftnium (Hf), or tantalum (Ta)), and X denotes an element from the group of {sulfur (S), selenium (Se), or tellurium (Te)}.

Some embodiments in accordance with this disclosure incorporate the above mentioned 2-D materials into transistor gate architectures such as fin-based structures. Utilizing the 2-D materials in a vertical semiconductor structure can provide a number of benefits such as, among others, (i) high carrier mobility; (ii) a higher packing density compared to transistor structures that do not implement 2-D materials; and (iii) compact double-gate structures.

First, the unique electrical properties of the 2-D materials make them promising candidates for use in transistors structures due to their high carrier mobility. For instance, a S/D doping process will no longer be necessary like that required by devices adopting conventional silicon-based materials, since the surfaces of these 2-D materials demonstrate metallic/conductive behavior when they are in contact with metal, and conductive channel regions made by 2-D materials can be quickly and reliably turned on or off by applying suitable gate voltages.

Second, the semiconductor device in accordance with some embodiments provides a higher packing density compared to transistor structures that do not implement 2-D materials. The compact vertical structures and minimal body thickness made possible by thin layered 2-D materials allow further reduction in device dimension without sacrificing device performance, and in turn results in higher packing density. For example, 2-D materials such as a one molecule thick graphene layer has an example thickness of 0.34 nm. Therefore, the implementation of suitable 2-D materials in 3-D device architectures can yield further scaled, high-performance low-power devices adaptable for aggressive (e.g., sub 15 nm) gate lengths. Furthermore, vertical devices that utilize the composite structure can provide the basis for a stackable, self-insulated monolithic 3-D integrated circuit (3DIC), enabling even higher degrees of device integration.

Third, compact double-gate semiconductor structures with ultra-thin 2-D material channel regions may be achieved through the vertical semiconductor structures utilizing 2-D materials deposited on sacrificial vertical mechanical supports.

Before describing the embodiments related to the design of transistor gate architectures utilizing 2-D materials, an example fabrication process for a FinFET is presented. FIG. 1 provides an isometric view of a semiconductor device that includes partially fabricated FinFETs, in accordance with some embodiments.

FIG. 1 is an isometric view of a semiconductor structure 100, according to some embodiments. Semiconductor structure 100 includes FinFETs. Semiconductor structure 100 includes a substrate 102, a plurality of fins 104, a plurality of isolation structures 106, and a gate structure 108. Gate structure 108 is disposed over sidewalls and a top surface of each of fins 104. Fins 104 and isolation structures 106 have top surfaces 114 and 118, respectively. Gate structure 108 includes a gate dielectric structure 115 and a gate electrode structure 117. In some embodiments, one or more additional layers or structures can be included in gate structure 108.

FIG. 1 shows a hard mask 120 disposed on a top surface of gate electrode structure 117. Hard mask 120 is used to pattern, such as by etching, gate structure 108. In some embodiments, hard mask 120 is made of a dielectric material such as, for example, silicon nitride. The isometric view of FIG. 1 is taken after the patterning process (e.g., etching) of a gate dielectric layer and a gate electrode layer to form gate structure 108. FIG. 1 shows a gate structure 108. A person of ordinary skill in the art will understand that integrated circuits can include a plurality of such, and similar, gate structures.

Each of the plurality of fins 104 shown in FIG. 1 includes a pair of source/drain (S/D) terminals, where a source terminal is referred to as source region $\mathbf{110}_S$ and a drain terminal is referred to as drain region $\mathbf{110}_D$. A person of ordinary skill in the art will recognize that the source and drain regions $\mathbf{110}_S$ and $\mathbf{110}_D$ are interchangeable and are formed in, on, and/or surrounding fins 104. A channel region 112 of fins 104 underlies gate structure 108. Gate structure 108 has a gate length L and a gate width ($2\times H_F+W$), as shown in FIG. 1. In some embodiments, the gate length L is in a range from about 10 nm to about 30 nm. In some embodiments, the gate length L is in a range from about 3 nm to about 10 nm. In some embodiments, the fin width W is in a range from about 6 nm to about 12 nm. In some embodiments, the fin width W is in a range from about 4 nm to about 6 nm. Gate height $H_G$ of gate structure 108, measured from a fin top surface 114 to the top of gate structure 108, is in a range from about 50 nm to about 200 nm, in some embodiments. Fin height $H_F$ of fin 104, measured from the isolation structure top surface 118 to fin top surface 114, is in a range from about 25 nm to about 100 nm, in some embodiments.

Substrate 102 can be a silicon substrate, according to some embodiments. In some embodiments, substrate 102 can be (i) another semiconductor, such as germanium (Ge); (ii) a compound semiconductor including silicon carbide, gallium arsenide, gallium phosphide, indium phosphide, indium arsenide, gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), and/or indium antimonide; (iii) an alloy semiconductor including silicon germanium (SiGe); or (iv) combinations thereof. In some embodiments, substrate 102 can be a semiconductor on insulator (SOI). In some embodiments, substrate 102 can be an epitaxial material.

Isolation structures 106 are made of a dielectric material and can be formed of silicon oxide, spin-on-glass, silicon nitride, silicon oxynitride, fluorine-doped silicate glass (FSG), a low-k dielectric material, and/or other suitable insulating material. Isolation structures 106 can be shallow trench isolation (STI) structures. In some embodiments, the isolation structures are STI structures and are formed by etching trenches in substrate 102. The trenches can be filled with insulating material, followed by a chemical mechanical polish (CMP) and etch-back. Other fabrication techniques for isolation structures 106 and/or fins 104 are possible. Isolation structures 106 can include a multi-layer structure such as, for example, a structure with one or more liner layers.

Fins 104 are active regions where one or more transistors are formed. Fins 104 can include: (i) silicon (Si) or another elementary semiconductor, such as germanium; (ii) a compound semiconductor including silicon carbide, gallium arsenide, gallium phosphide, indium phosphide, indium arsenide, GaAsP, AlInAs, AlGaAs, GaInAs, GaInP, GaInAsP and/or indium antimonide; (iii) an alloy semiconductor including SiGe; or (iv) combinations thereof. Fins 104 can be fabricated using suitable processes including photolithography and etch processes. The photolithography process can include forming a photoresist layer (resist) overlying the substrate (e.g., on a silicon layer), exposing the resist to a pattern, performing post-exposure bake processes, and developing the resist to form a masking element including the resist. The masking element can then be used to protect regions of the substrate while an etch process forms recesses into isolation structures 106, leaving protruding fins. The recesses can be etched using a reactive ion etch (RIE) and/or other suitable processes. Numerous other methods to form fins 104 on substrate 102 may be suitable. For example, fins 104 can include epitaxial material, in accordance with some embodiments.

Gate structure 108 can include a gate dielectric layer 115, a gate electrode structure 117, a spacer layer 111, and/or one or more additional layers, according to some embodiments. For ease of description, spacer layer 111 is not shown in FIG. 1. In some embodiments, gate structure 108 uses polysilicon as gate electrode structure 117. Also shown in FIG. 1 is a hard mask 120 disposed on a top surface of gate electrode structure 117. Hard mask 120 is used to pattern, such as by etching, gate structure 108. In some embodiments, hard mask 120 is made of a dielectric material, such as silicon nitride.

Although gate structure 108 is described as using polysilicon or amorphous silicon for gate electrode structure 117, a person of ordinary skill in the art will understand that gate structure 108 can be a sacrificial gate structure such as formed in a replacement gate process used to form a metal gate structure. The replacement gate process and associated manufacturing steps can be performed and are not shown in these figures. The metal gate structure can include barrier layer(s), gate dielectric layer(s), work function layer(s), fill metal layer(s) and/or other suitable materials for a metal gate structure. In some embodiments, the metal gate structure can include capping layers, etch stop layers, and/or other suitable materials.

Exemplary p-type work function metals that can be included in the metal gate structure are titanium nitride (TiN), tantalum nitride (TaN), ruthenium (Ru), Mo, aluminum (Al), tungsten nitride (WN), zirconium disilicide ($ZrSi_2$), molybdenum disilicide ($MoSi_2$), tantalum disilicide ($TaSi_2$), nickel disilicide ($NiSi_2$), platinum (Pt), other suitable p-type work function materials, or combinations thereof. Exemplary n-type work function metals that can be included in the metal gate structure are Al, titanium (Ti), silver (Ag), tantalum aluminum (TaAl), tantalum aluminum carbon (TaAlC), tantalum aluminum nitride (TiAlN), tantalum carbide (TaC), tantalum carbide nitride (TaCN), tantalum silicide nitride (TaSiN), manganese (Mn), zirconium (Zr), other suitable n-type work function materials, or combinations thereof. A work function is associated with the material composition of the work function layer. Thus, the material of a work function layer is chosen to tune its work function so that a desired threshold voltage $V_{th}$ can be achieved by a device formed in the respective region. The work function layer(s) may be deposited by chemical vapor deposition (CVD), plasma-enhanced chemical vapor deposition (PECVD), atomic layer deposition (ALD), and/or other suitable processes.

A fill metal layer can be deposited over the work function metal layer(s). The fill metal layer fills in remaining portions of trenches or openings formed by removal of the sacrificial gate structure The fill metal layer can include Al, W, copper (Cu), and/or other suitable materials. The fill metal can be formed by ALD, CVD, physical vapor deposition (PVD), plating, and/or other suitable processes.

Semiconductor device structure 100 described above includes fins 104 and gate structure 108. The semiconductor device structure 100 may require additional processing to form various features such as, for example, lightly-doped-drain (LDD) regions and doped S/D structures. The term "LDD region" is used to describe lightly-doped regions disposed between a channel region of a transistor and at least one of the transistor's S/D regions. LDD regions can be formed in fins 104 by doping. Ion implantation can be used, for example, for the doping process. A person of ordinary skill in the art will recognize that other processes can be used for doping the LDD regions.

FIG. 2A through FIG. 6 are perspective and cross-sectional views of various fabrication stages of a partially fabricated fin-based structure incorporating 2-D materials, in accordance with some embodiments of the present disclosure. The fin-based structure can be a fin-based transistor incorporating 2-D materials. The fabrication process for the fin-based structure described herein is exemplary. A person of ordinary skill in the art will recognize that additional steps can be performed to form the fin-based structure.

Figure 2B:
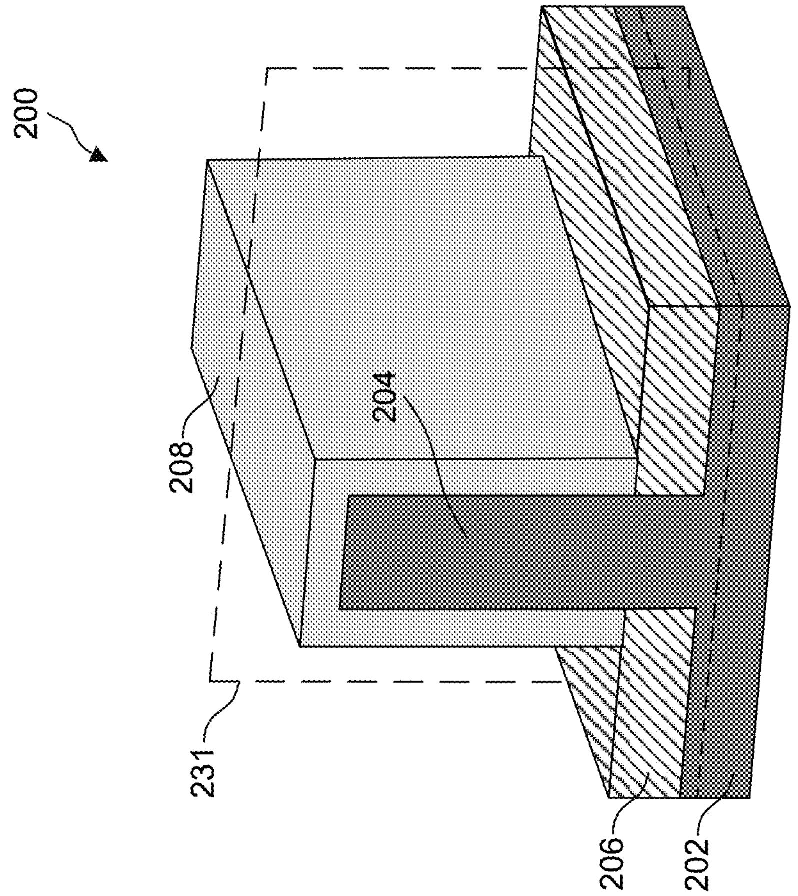
FIGS. 2A-2B are respective cross-sectional and isometric views of a partially fabricated fin-based structure after fin formation and the deposition of inter-layer dielectric (ILD) and back gate insulator layer, in accordance with some embodiments.
Figure 2A:
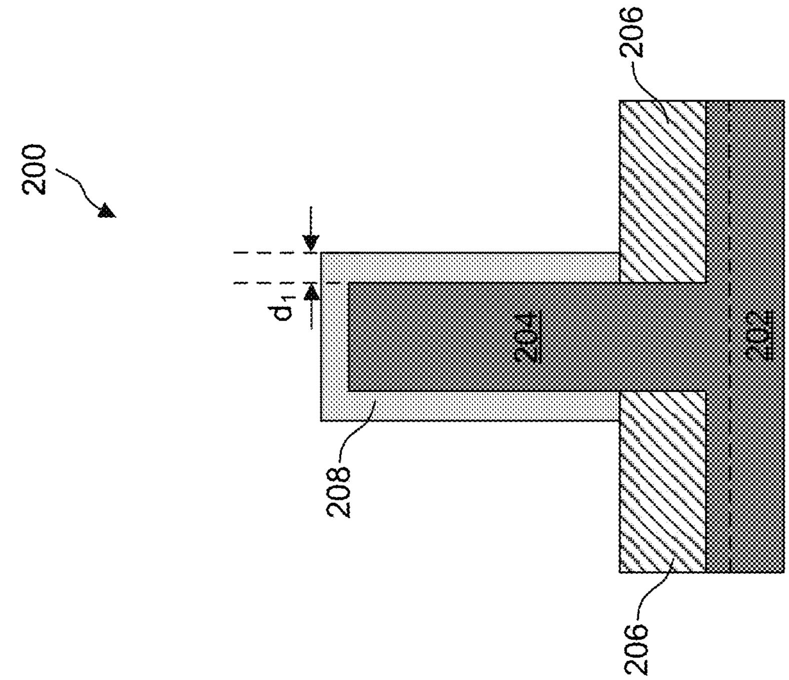

FIGS. 2A-2B are respective cross-sectional and isometric views of a partially fabricated fin-based transistor after fin formation and deposition of an inter-layer dielectric (ILD) layer and a back gate insulator layer, in accordance with some embodiments.

FIG. 2A is the cross-sectional view of fin-based transistor 200 taken along a cut 231 shown in FIG. 2B. Fin-based transistor 200 includes a substrate 202, a fin 204, a plurality of isolation structures 206, and a back gate insulator layer 208 disposed over the sidewalls and a top surface of fin 204. It should be noted that fin-based transistor 200 can include a plurality of fins 204, which are not shown in FIGS. 2A and 2B for simplicity.

Fin 204 is representative of a raised feature formed on substrate 202, and can be formed by a portion of substrate 202 or formed by disposing a structure on substrate 202. Fin 204 can be fabricated using suitable processes such as, for example, photolithography and etch processes. The photolithography process can include forming a photoresist layer (resist) overlying substrate 202 (e.g., on a silicon layer), exposing the resist to a pattern, performing post-exposure bake processes, and developing the resist to form a masking element including the resist. The masking element can be used to protect regions of substrate 202 while an etch process forms recesses leaving protruding fin 204. The recesses can be etched using a reactive ion etch (RIE) and/or other suitable processes. Numerous other methods to form fin 204 on substrate 202 may be suitable. Fin 204 can include: (i) silicon or another elementary semiconductor, such as germanium; (ii) a compound semiconductor including silicon carbide, gallium arsenide, gallium phosphide, indium phosphide, indium arsenide, GaAsP, AlInAs, AlGaAs, GaInAs, GaInP, GaInAsP, and/or indium antimonide; (iii) an alloy semiconductor including SiGe; or (iv) combinations thereof.

In FIG. 2A, fin 204 is fabricated by photolithography and etching processes on substrate 202 and can be made from the same material. In some embodiments, substrate 202 can be a silicon substrate and fin 204 can include silicon material. In some embodiments, substrate 202 can include: (i) another elementary semiconductor, such as germanium; (ii) a compound semiconductor including silicon carbide, gallium arsenide, gallium phosphide, indium phosphide, indium arsenide, GaAsP, AlInAs, AlGaAs, GaInAs, GaInP, GaInAsP, and/or indium antimonide; (iii) an alloy semiconductor including SiGe; (iv) or combinations thereof. In some embodiments, substrate 202 can be a semiconductor-on-insulator (SOI) substrate.

Isolation structures 206 are made of a dielectric material and can be formed of, for example, silicon oxide, spin-on-glass, silicon nitride, silicon oxynitride, fluorine-doped silicate glass (FSG), a low-k dielectric material, and/or other suitable insulating material. Isolation structures 206 can be shallow trench isolation (STI) structures or inter-layer dielectric (ILD) structures. Isolation structures 206 can include a multi-layer structure such as, for example, a structure with one or more liner layers.

Back gate insulator layer 208 is disposed over the sidewalls and top surface of fin 204. Back gate insulator layer 208 can be formed by depositing an insulator material on fin-based transistor 200 and performing subsequent photolithography and etching processes. The photolithography process can include forming a photoresist layer overlying the insulator material on fin-based transistor 200, exposing the resist to a pattern, performing post-exposure bake processes, and developing the resist to form a masking element including the resist. The masking element can be used to protect regions of the insulator material while an etch process removes the insulator material from unprotected regions such as, for example, the top surfaces of isolation structures 206. The insulator material can be etched using a reactive ion etch (RIE) and/or other suitable processes. Numerous other methods to form back gate insulator layer 208 may be suitable. The thickness $d_1$ of back gate insulator 208 is in a range from about 1 nm to about 20 nm. Back gate insulator layer 208 includes dielectric materials such as, for example, materials characterized by their dielectric constant relative to silicon dioxide. Examples of gate dielectrics include, but are not limited to, one or more of silicon dioxide, silicon nitride, and high-k dielectric materials.

In some embodiments, back gate insulator layer 208 can be an optional layer if a back gate electrode layer is embedded within fin 204 and a metallic contact is connected the back gate electrode layer. Back gate insulator layer 208, embedded back gate electrode layer, and the metallic contact can form a back gate stack that can be independently controlled for a variety of purposes. For example, the back gate stack within fin 204 can be used for back biasing, which is a technique used to adjust the $V_{th}$ of the device and tune the device for power and performance, and/or uniform $V_{th}$ across devices.

Figure 3B:
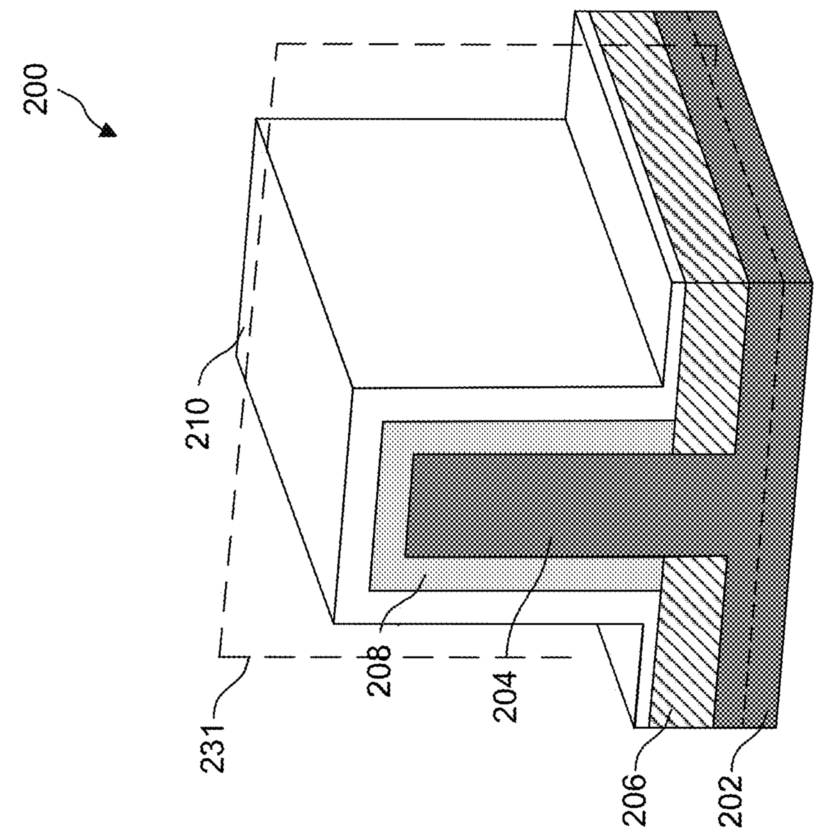
FIGS. 3A-3B are respective cross-sectional and isometric views of a partially fabricated fin-based structure after deposition of a 2-D material, in accordance with some embodiments.
Figure 3A:
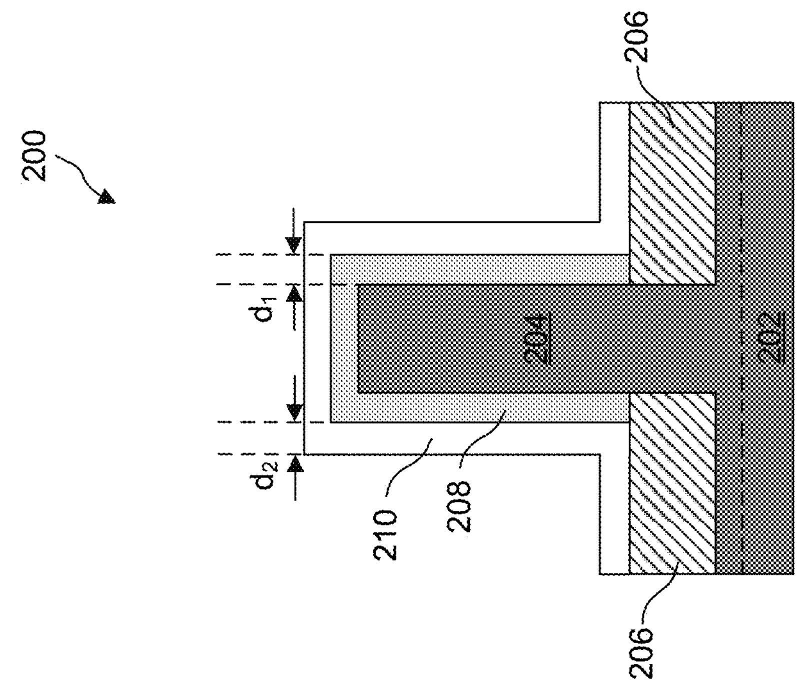

FIGS. 3A-3B are respective cross-sectional and isometric views of a partially fabricated fin-based transistor after the deposition of 2-D material, in accordance with some embodiments. FIG. 3A is the cross-sectional view of FIG. 3B taken along cut 231 shown in FIG. 3B.

The deposition of 2-D material forms a sheet layer 210 on isolation structure 206 and back gate insulator layer 208. The thickness of sheet layer 210 can be as low as the thickness of a single molecule layer. In some embodiments, the thickness $d_2$ of sheet layer 210 is in a range from about 0.5 nm to about 10 nm. With this thickness, sheet layer 210 can maintain sufficient carrier mobility. In some embodiments, sheet layer 210 can include one or more monolayers of graphene, a sheet based carbon structure, where each sheet is a single atom in thickness. Even in this configuration, graphene has high mobility.

Sheet layer 210 can include any suitable 2-D material, such as thin layers of graphene, graphene analogues, phosphorene, or TMDs. Sheet layer 210 can be formed using suitable deposition methods, including but not limited to epitaxial growth, atomic layer deposition (ALD), CVD, PEVCD, molecular beam epitaxy (MBE), or metal deposition with subsequent chemical reaction. In some embodiments, forming sheet layer 210 can include a Langmuir-Blodgett process. In some embodiments, forming sheet layer 210 can include deposition processes and subsequent annealing processes to improve the material quality by increasing the domain size and reducing the defects. More details on the deposition of 2-D material for sheet layer 210 are discussed below.

Using a graphene-containing 2-D material for example, sheet layer 210 can be formed by epitaxial graphene growth. In some embodiments, a silicon carbide dielectric is used as a seed layer to promote the epitaxial growth of the graphene on back gate insulator layer 208. Another exemplary technique for forming sheet layer 210 utilizes ALD or CVD directly on back gate insulator layer 208. Surface treatments such as plasma or chemical treatment can be used to promote adherence of sheet layer 210 to fin-based transistor 200. A thin liner layer can be deposited to promote adherence of the 2-D material, according to some embodiments. For example, a metal film can be deposited prior to the deposition of sheet layer 210. A metal carbide is formed by reacting the metal film with silicon carbide. The metal carbide is then annealed to produce a metal silicide and graphene from the remaining carbon. In some embodiments, graphene can be formed on a separate backing material and adhered to back gate insulator layer 208, followed by removing the backing material while leaving the graphene on back gate insulator layer 208. In some embodiments, graphene is deposited using an aqueous solution of graphene oxide.

Figure 4A:
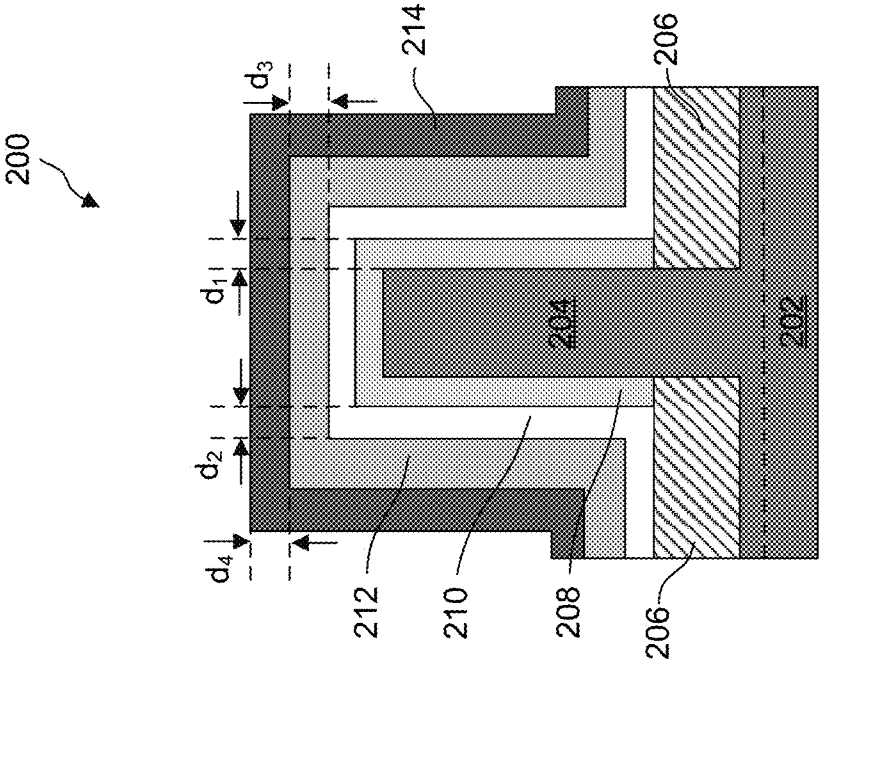
FIGS. 4A-4B are respective cross-sectional and isometric views of a partially fabricated fin-based structure after deposition of a gate electrode material, in accordance with some embodiments.
Figure 4B:
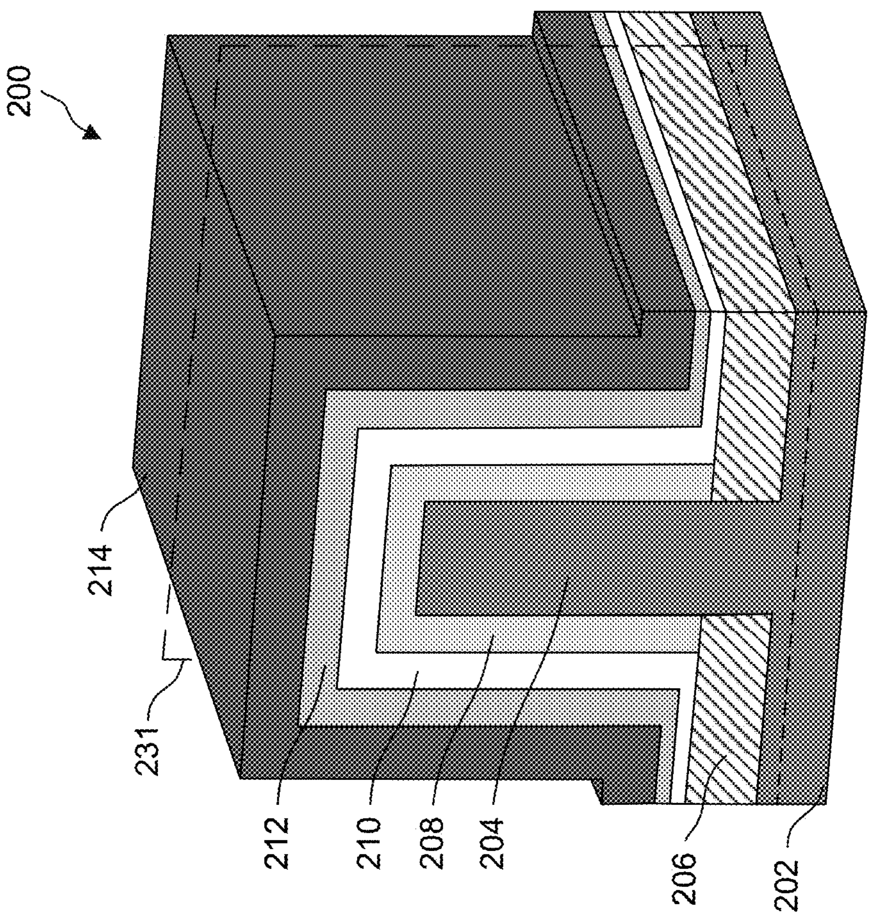

FIGS. 4A-4B are respective cross-sectional and isometric views of a partially fabricated fin-based transistor after the deposition of front gate insulator material and gate electrode material, in accordance with some embodiments. FIG. 4A is the cross-sectional view of FIG. 4B taken along cut 231 shown in FIG. 4B.

Front gate insulator layer 212 is disposed over the exposed sheet layer 210. Front gate insulator layer 212 can be formed by depositing an insulator material through suitable deposition methods such as, for example, CVD, PECVD, ALD, or MBE. Numerous other methods to form front gate insulator layer 212 may be suitable. In some embodiments, gate insulator layer 212 can be a multi-layer structure that includes one or more layers. Front gate insulator layer 212 includes dielectric materials, which are characterized by their dielectric constant relative to silicon dioxide. Examples of gate dielectrics include, but are not limited to, one or more of silicon dioxide, silicon nitride, and high-k dielectric materials. In some embodiments, the thickness $d_3$ of front gate insulator layer 212 is in a range from about 1 nm to about 10 nm.

Gate electrode layer 214 is formed over front gate insulator layer 212. Gate electrode layer 214 can be a polysilicon layer or a conductive layer. A person of ordinary skill in the art will understand that gate electrode layer 214 can be a sacrificial gate structure such as a structure formed in a replacement gate process for a metal gate structure. The deposition of a suitable gate material to form gate electrode layer 214 can include CVD, PVD, ALD, MBE, high density plasma CVD (HDPCVD), metal organic CVD (MOCVD), remote plasma CVD (RPCVD), PECVD, plating, other suitable methods, and/or combinations thereof. In some embodiments, the thickness $d_4$ of gate electrode layer 214 is in a range from about 1 nm to about 100 nm. The replacement gate process and associated manufacturing steps can be performed and are not shown in these figures. The metal gate structure can include interfacial layer(s), gate dielectric layer(s), work function layer(s), fill metal layer(s) and/or other suitable materials for a metal gate structure. In some embodiments, the metal gate structure can include capping layers, etch stop layers, and/or other suitable materials. In some embodiments, gate electrode layer 214 can include suitable materials such as, for example, aluminum, tungsten, copper, and/or other suitable materials. The interfacial layer can include a dielectric material such as, for example, a silicon oxide ($SiO_2$) layer or a silicon oxynitride (SiON) layer. The interfacial dielectric layer can be formed by chemical oxidation, thermal oxidation, ALD, CVD, and/or other suitable formation process.

Figure 5:
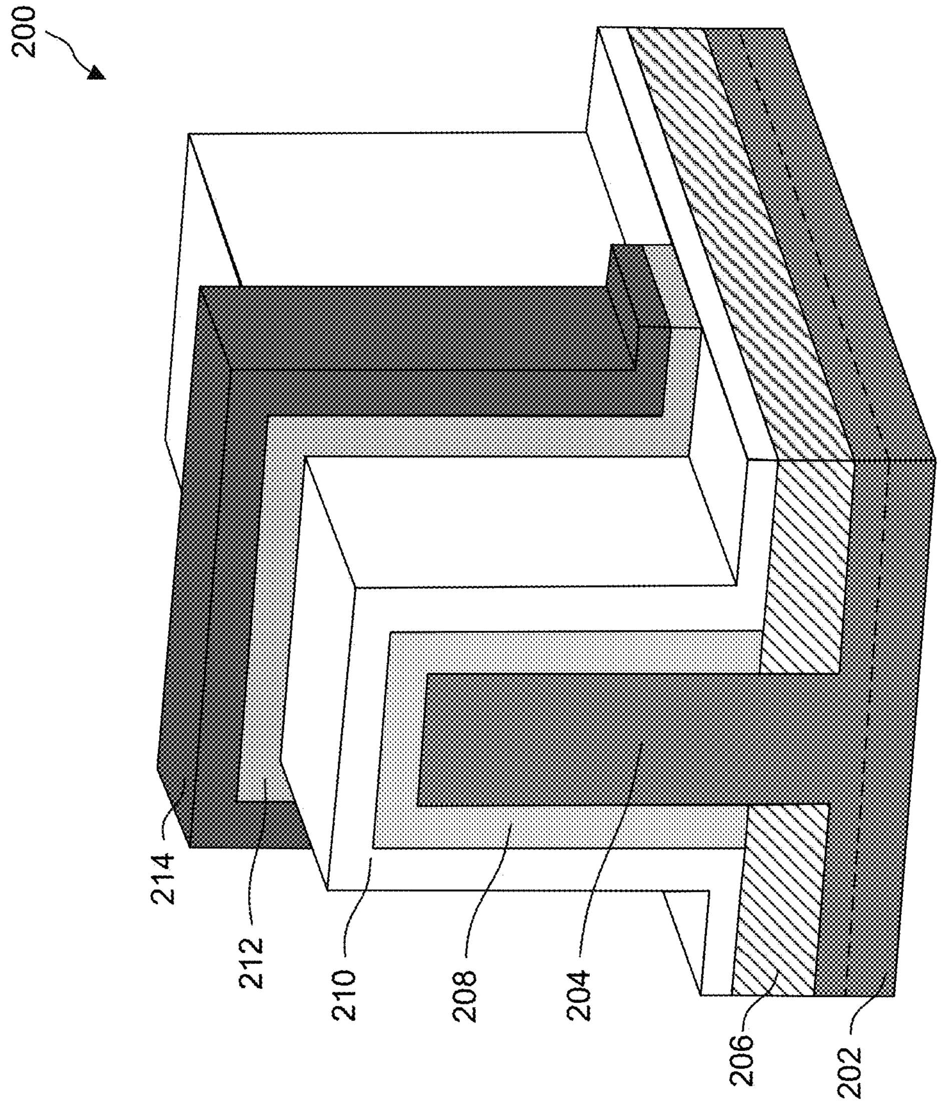
FIG. 5 is an isometric view of a partially fabricated fin-based structure after removal of a portion of a gate material and a gate oxide layer, in accordance with some embodiments.

FIG. 5 is an isometric view of a partially fabricated fin-based transistor after the removal of a portion of the gate material and the gate oxide layer, in accordance with some embodiments.

The etching of front gate insulator layer 212 and gate electrode layer 214 can include depositing a photoresist material on fin-based transistor 200, exposing and patterning the photoresist to expose the portion of front gate insulator layer 212 and gate electrode layer 214 to be etched, and etching the exposed portion of front gate insulator layer 212 and gate electrode layer 214. The etching can include any suitable etching technique such as, for example, dry etching, wet etching, reactive ion etching, and/or other etching methods. Fin-based transistor 200 can be a fin-based transistor, where the remaining front gate insulator layer 212 and gate electrode layer 214 form a front gate stack. The portion of sheet layer 210 that is under the remaining front gate insulator layer 212 and gate electrode layer 214 form a channel region of the fin-based transistor.

Figure 6:
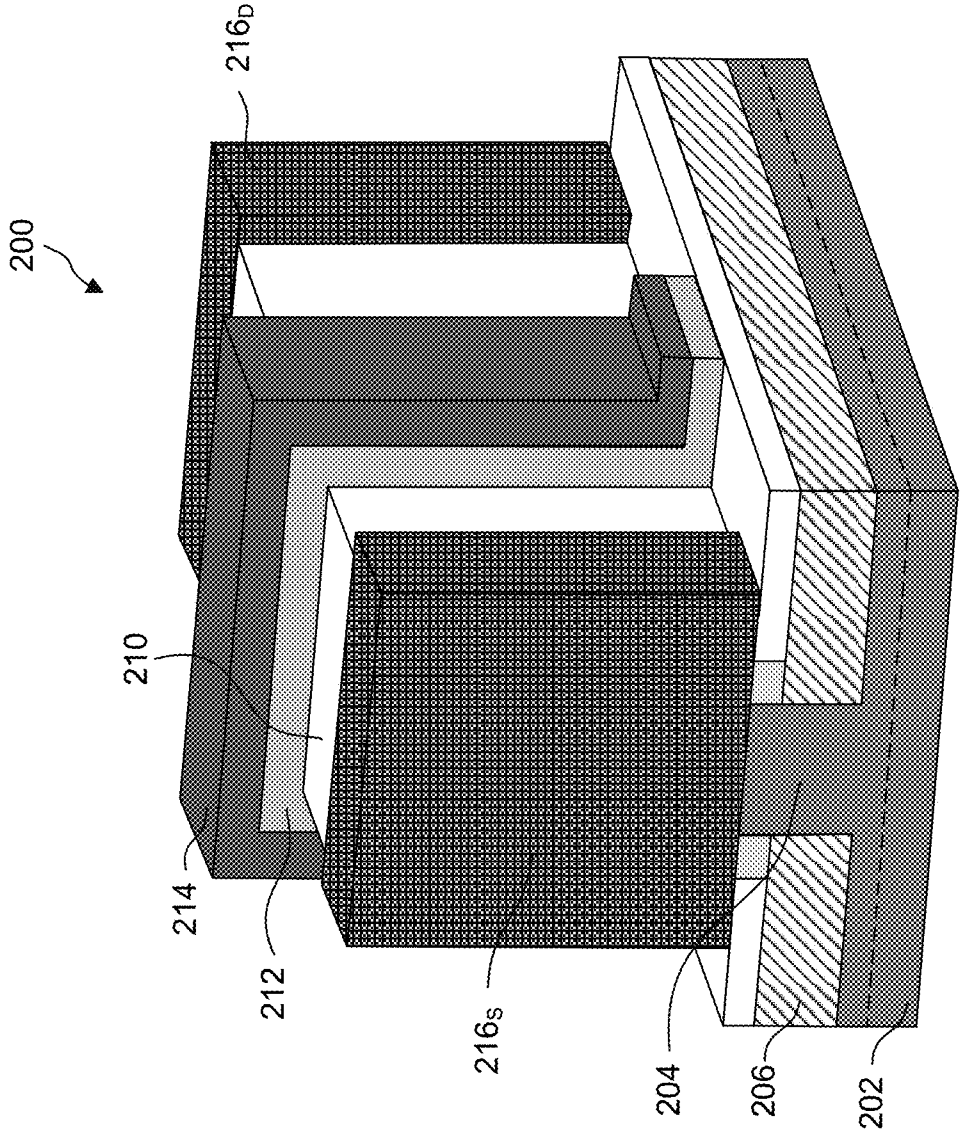
FIG. 6 is an isometric view of a partially fabricated fin-based structure after source and drain metallization, in accordance with some embodiments.

FIG. 6 is an isometric view of a partially fabricated fin-based transistor after forming metal source and drain terminals, in accordance with some embodiments. For ease of description, a source terminal is referred to as source region $\mathbf{216}_S$ and a drain terminal is referred to as drain region $\mathbf{216}_D$. A person of ordinary skill in the art will recognize that the source and drain regions $\mathbf{216}_S$ and $\mathbf{216}_D$ are interchangeable and are formed on, and/or surrounding portions of exposed sheet layer 210 and fin 704. Sheet layer 210 that is not covered by front gate insulator layer 212 and gate electrode layer 214 can be considered as S/D regions. S/D terminals $\mathbf{216}_S$ and $\mathbf{216}_D$ are physically and electrically connected to the S/D regions and provide electrical access to external interconnections or devices. S/D terminals include metallic material such as, for example, platinum, nickel, cobalt, tantalum, titanium, platinum, erbium, palladium, aluminum, and/or tungsten. The metal can be deposited using conventional processes such as physical vapor deposition (PVD), CVD, PECVD, ALD, atmospheric pressure chemical vapor deposition (APCVD), low-pressure CVD (LPCVD), high density plasma CVD (HDPCVD), or atomic layer CVD (ALCVD). After deposition, S/D terminals $\mathbf{216}_S$ and $\mathbf{216}_D$ are defined using photolithography and etching processes. The photolithography process can include forming a photoresist layer, exposing the resist to a pattern, performing post-exposure bake processes, and developing the resist to form a masking element including the resist. The masking element can be used to protect regions of the metal layer while an etch process removes the metal layer from unprotected regions such as, for example, the metal layer on the top and side surfaces of gate electrode layer 214, as well as the metal layer formed over the side surfaces of front gate insulator layer 212 and a portion of exposed sheet layer 210. The metal layer can be etched using RIE, chemical wet etching, and/or other suitable processes.

In some embodiments, the S/D features are formed by epitaxially growing a semiconductor material layer in the S/D regions. In some embodiments, sacrificial sidewall spacers can be formed prior to epitaxial S/D growth and removed after epitaxial S/D growth. In some embodiments, the semiconductor material layer grown in the S/D regions includes Ge, Si, GaAs, AlGaAs, SiGe, GaAsP, SiP, or other suitable material. The S/D features can be formed by one or more epitaxial processes. In some embodiments, the S/D features can be in-situ doped during the epitaxial process. For example, in some embodiments, epitaxially grown SiGe S/D features can be doped with boron. In some embodiments, epitaxially grown Si epitaxial S/D features can be doped with carbon to form Si:C S/D features, phosphorous to form Si:P S/D features, or both carbon and phosphorous to form SiCP S/D features. In some embodiments, the S/D features are not in-situ doped, and instead an implantation process is performed to dope the S/D features. S/D regions $\mathbf{216}_S$ and $\mathbf{216}_D$ can have various cross-section shapes such as, for example, square, rectangle, pentagon, and/or other suitable shapes thereof.

The processes described with reference to FIGS. 2A-6 above forms a fin-based transistor incorporating 2-D materials. The fin-based transistor includes conductive channel regions formed by 2-D materials that can be turned on or off by applying suitable gate voltages to a front gate stack. The fin-based transistor also includes an optional back gate stack for independently controlling the $V_{th}$ of the transistor and for tuning the $V_{th}$ for power, performance, and/or consistency across devices. The vertical structure of the fin-based transistor allows for further reduction in device dimension by utilizing vertical space, and also provides more channel area for better device performance.

FIG. 7A through FIG. 17B are perspective and cross-sectional views of various fabrication stages of a partially fabricated fin-based structure incorporating 2-D materials, in accordance with various illustrative embodiments of the present disclosure. The fin-based structure can be a fin-based double-gate transistor incorporating 2-D materials. The fabrication process for the fin-based structure described herein is exemplary. A person of ordinary skill in the art will recognize that additional steps can be performed to form the fin-based structure.

Figure 7B:
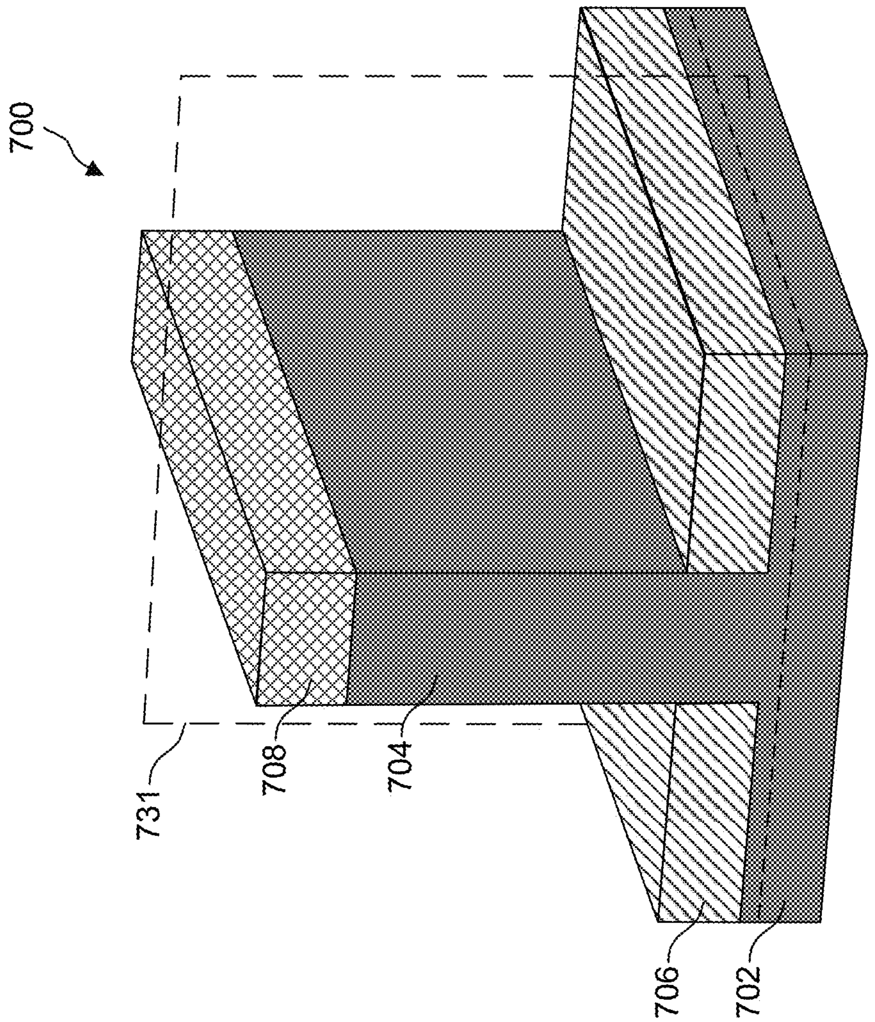
FIGS. 7A-7B show respective cross-sectional and isometric views of a partially fabricated double-gate semiconductor structure after fin formation and hard mask deposition, in accordance with some embodiments.
Figure 7A:
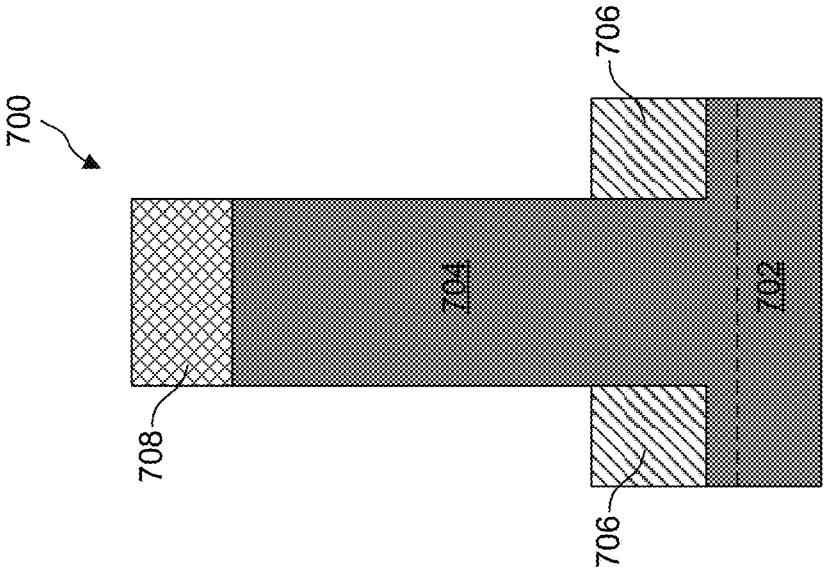

FIGS. 7A-7B are respective cross-sectional and isometric views of a partially fabricated fin-based double-gate transistor after fin formation using a hard mask and an ILD deposition, in accordance with some embodiments.

FIG. 7A is the cross-sectional view of fin-based double-gate transistor 700 taken along a vertical cut 731 shown in FIG. 7B. Fin-based double-gate transistor 700 includes substrate 702, fin 704, a plurality of isolation structures 706, and a hard mask layer 708 that is disposed over the top surface of fin 704. It should be noted that fin-based transistor 700 can include a plurality of fins 704, and are not shown here for simplicity.

Fin 704 is representative of a raised feature formed on substrate 702, and can be formed by a portion of substrate 702 or formed by disposing a structure on substrate 702. Fin 704 can be fabricated using suitable processes such as, for example, photolithography and etch processes. The photolithography process can include forming a photoresist layer overlying substrate 702, and using a hard mask layer as the masking element, in some embodiments. As shown in FIG. 7A, hard mask 708 is used to protect regions of the substrate while an etch process forms recesses leaving protruding fins. Hard mask 708 can include any suitable material such as, for example, silicon nitride, silicon oxynitride (SiON), silicon carbide (SiC), silicon nitrocarbide (SiCN), spin-on glass (SOG), a low-k film, or silicon oxide. Such silicon oxide can be formed by any suitable method including, but not limited to CVD with tetraethyl orthosilicate (TEOS) as a source gas, PE-oxide, high aspect ratio process (HARP) formed oxide. To expose a portion of substrate 702 for etching fin 704, hard mask 708 is patterned using a photolithography process that includes disposing a photoresist layer, exposing the photoresist layer to a pattern, performing post-exposure bake processes, and developing the resist to form a patterned photoresist. Exposed hard mask layer is etched using suitable etching processes such as, for example, an RIE etching process or a chemical wet etching process. To form fins 704, portions of substrate 702 not protected by hard mask 708 are etched to form recesses. The etching processes can be an RIE process or a chemical wet etching process, and numerous other methods to form fins 704 on substrates may also be suitable. Fin 704 can include: (i) silicon or another semiconductor material, such as germanium; (ii) a compound semiconductor including silicon carbide, gallium arsenide, gallium phosphide, indium phosphide, indium arsenide, GaAsP, AlInAs, AlGaAs, GaInAs, GaInP, GaInAsP, and/or indium antimonide; (iii) an alloy semiconductor including SiGe; or (iv) combinations thereof.

Figure 8A:
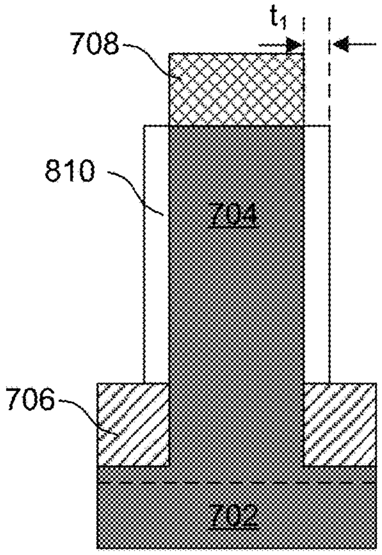
FIG. 8A is a cross-sectional view of a partially fabricated double-gate semiconductor structure after deposition of a 2-D material on exposed sidewalls of a fin, in accordance with some embodiments.
Figure 8B:
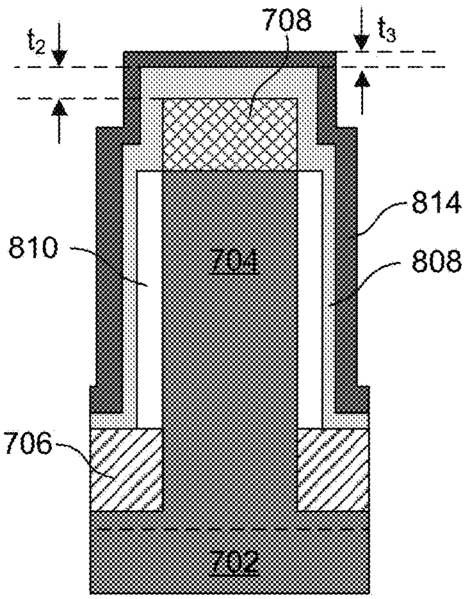
FIG. 8B is a cross-sectional view of a partially fabricated FinFET after deposition of a gate insulator layer and a gate electrode layer, in accordance with some embodiments.

FIGS. 8A-8B are cross-sectional views of a partially fabricated fin-based double-gate transistor after direct deposition of 2-D material on exposed side of the fin and deposition of gate oxide and gate metal layer, in accordance with some embodiments.

FIG. 8A shows the deposition of a 2-D material that forms a sheet layer 810 on exposed areas of fin 704. The exposed areas of fin 704 can provide mechanical support for the disposed sheet layer 810, and the thickness of sheet layer 810 can be as low as the thickness of a single molecule layer but while providing sufficient carrier mobility. For example, in some embodiments, sheet layer 810 can include one or more monolayers of graphene which is a sheet-based carbon structure, where each sheet is a single atom in thickness. Sheet layer 210 can include any suitable 2-D material such as, for example, thin layers of graphene, graphene analogues, phosphorene, or TMDs. Sheet layer 810 can be formed using suitable deposition methods such as, for example, epitaxial growth, ALD, CVD, PEVCD, MBE, or metal deposition with subsequent chemical reaction.

Sheet layer 810 can be disposed only on exposed areas of fin 704 by suitable methods. In some embodiments, deposition of adhesive layers on exposed surfaces of fin 704 can be used to promote adherence of sheet layer 810. In some embodiments, sheet layer 810 can be formed on exposed areas of fin 704 using CVD or ALD. Surface treatments such as plasma or chemical treatment can be used to promote adherence of sheet layer 810 to fin 704. In some embodiments, graphene can be formed on a separate backing material and adhered to exposed areas of fin 704, followed by removing the backing material while leaving the graphene on fin 704. In some embodiments, graphene can be is deposited using an aqueous solution of graphene oxide.

FIG. 8B shows gate insulator layer 808 and first gate electrode layer 814 formed over the partially formed fin-based double-gate transistor structure described with reference to FIG. 8A.

Insulator layer 808 and first gate electrode layer 814 can be disposed sequentially over exposed surfaces of partially fabricated fin-based double-gate transistor 700 that includes isolation structure 706, sheet layer 810, and hard mask 708. Insulator layer 808 and first gate electrode layer 814 can be formed by depositing an insulator material and a gate electrode material on fin-based double-gate transistor 700. Insulator layer 808 can include dielectric materials, which are characterized by their dielectric constant relative to silicon dioxide. Examples of gate dielectrics include, but are not limited to, one or more of silicon dioxide, silicon nitride, and high-k dielectric materials. In some embodiments, first gate electrode layer 814 can be a metallic layer. In some embodiments, first gate electrode layer 814 can be a conductive layer. In some embodiments, first electrode layer 814 can include suitable materials such as, for example, aluminum, tungsten, copper, and/or other suitable materials. In some embodiments, the thickness $t_2$ of insulator layer 808 is in a range of about 1 nm to about 10 nm. In some embodiments, insulator layer 808 can be a multi-layer structure having one or more layers. The deposition processes of a first gate electrode layer 814 can include CVD, PVD, ALD, MBE, HDPCVD, MOCVD, RPCVD, PECVD, plating, other suitable methods, and/or combinations thereof. A person having ordinary skill in the art will understand that first gate electrode layer 814 can also be a sacrificial gate structure such as formed in a replacement gate process used to form a metal gate structure. The metal gate structure can include interfacial layer(s), gate dielectric layer(s), work function layer(s), fill metal layer(s) and/or other suitable materials for a metal gate structure. In other embodiments, the metal gate structure can further include capping layers, etch stop layers, and/or other suitable materials. The interfacial layer can include a dielectric material such as a $SiO_2$ or SiON. The interfacial dielectric layer can be formed by chemical oxidation, thermal oxidation, ALD, CVD, and/or other suitable formation process.

Figure 9A:
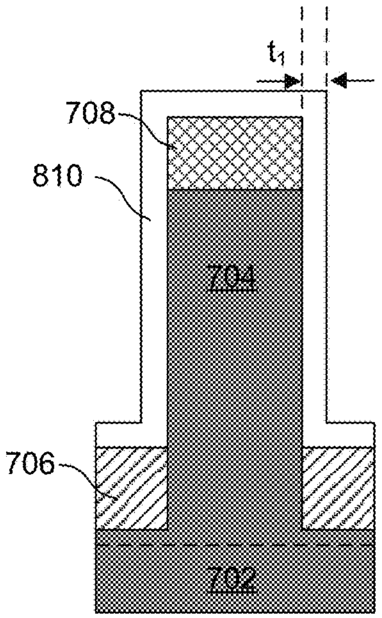
FIG. 9A is a cross-sectional view of a partially fabricated double-gate semiconductor structure after deposition of a 2-D material, in accordance with some embodiments.

In some embodiments, 2-D material sheet layer 810 can be formed by a deposition and etch back process. FIG. 9A shows the deposition of a 2-D material that forms sheet layer 810 on exposed areas of fin 704 and isolation structure 706. As mentioned above, sheet layer 810 can include any suitable 2-D material such as, for example, thin layers of graphene, graphene analogues, phosphorene, or TMDs. Sheet layer 810 can be deposited on exposed surfaces of fin-based double-gate transistor 700 using suitable deposition methods such as, for example, epitaxial growth, ALD, CVD, PEVCD, MBE, or metal deposition with subsequent chemical reaction. Further details of 2-D materials deposition can be found above with reference to FIG. 8B above.

Figure 9B:
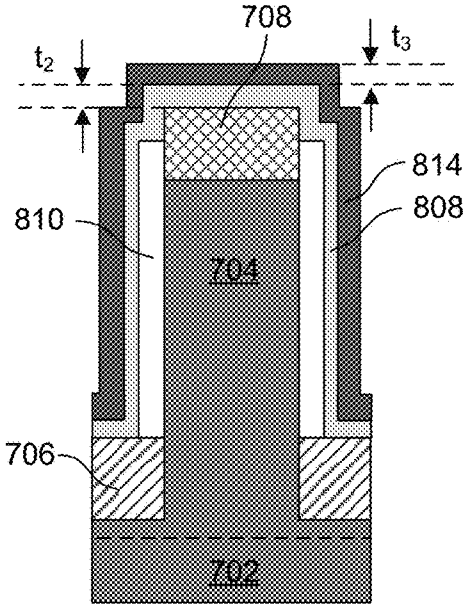
FIG. 9B is a cross-sectional view of a partially fabricated double-gate semiconductor structure after an etch back of a 2-D material and deposition of a gate insulator layer and a gate electrode layer, in accordance with some embodiments.

FIG. 9B shows the sheet layer 810 can be etched back such that it remains on the vertical structure of fin-based double-gate transistor 700 and covers at least the exposed areas of fin 704. In some embodiments, the thickness $t_1$ of sheet layer 810 is in a range of about 0.5 nm to about 10 nm. In some embodiments, sheet layer 810 can be formed on a separate backing material and adhered to exposed areas of fin 704, followed by removing the backing material while leaving sheet layer 810 on desired areas of fin 704. Excessive sheet layer 810 can be formed on the top surfaces of isolation structure 706 and hard mask 708 can be removed via suitable etching processes, such as an RIE process, in some embodiments. The RIE process can be an anisotropic etch process with higher etching speed in the vertical direction that is along the height of fin 704. In this way, 2-D material can be selectively removed from the top surfaces of isolation structure 706 and hard mask 708, leaving sufficient 2-D material to cover the exposed side walls of fin 704. Thus the remaining 2-D material forms sheet layer 810. As shown in FIG. 9B, the height of sheet layer 810 exceeds the interface of fin 704 and hard mask 708. In some embodiments, the height of sheet layer 810 could also be level with the interface, as shown in FIG. 8B above.

Similar to the partially fabricated double-gate transistor 700 described with reference to FIG. 8B, insulator layer 808 and first gate electrode layer 814 can be disposed sequentially over exposed surfaces of the structure in FIG. 9A. In some embodiments, the thickness $t_3$ of first gate electrode layer 814 is in a range of about 1 nm to about 100 nm.

Figure 10B:
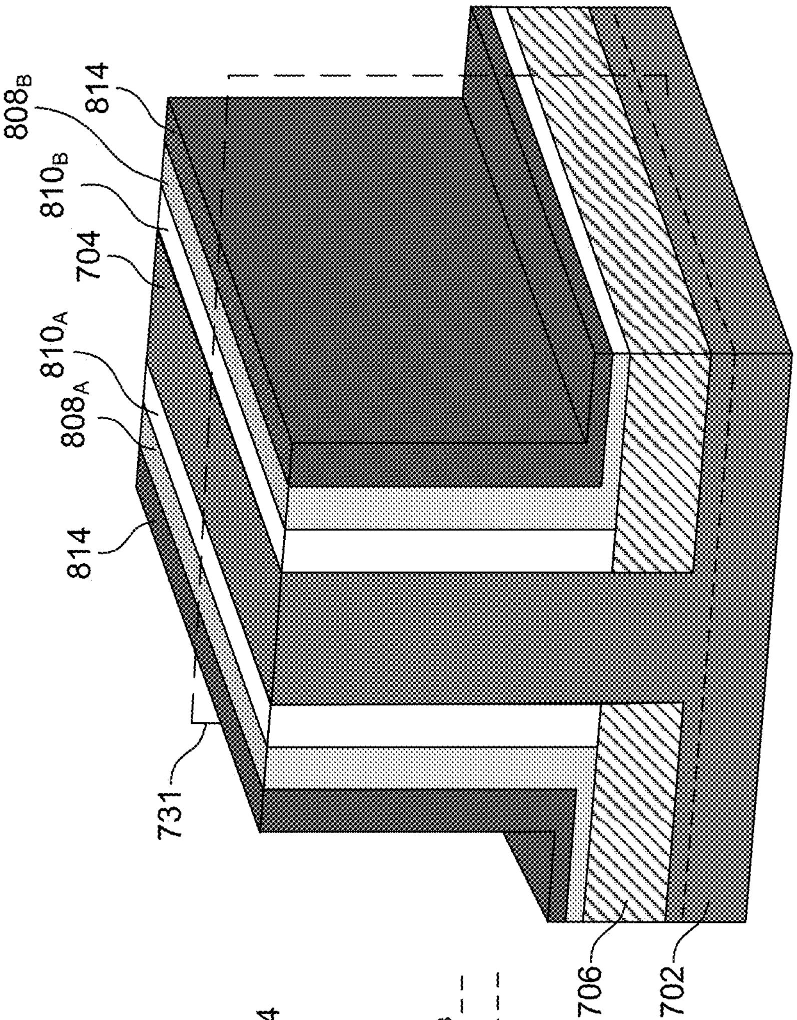
FIGS. 10A-10B show respective cross-sectional and isometric views of a partially fabricated double-gate semiconductor structure after planarization, in accordance with some embodiments.
Figure 10A:
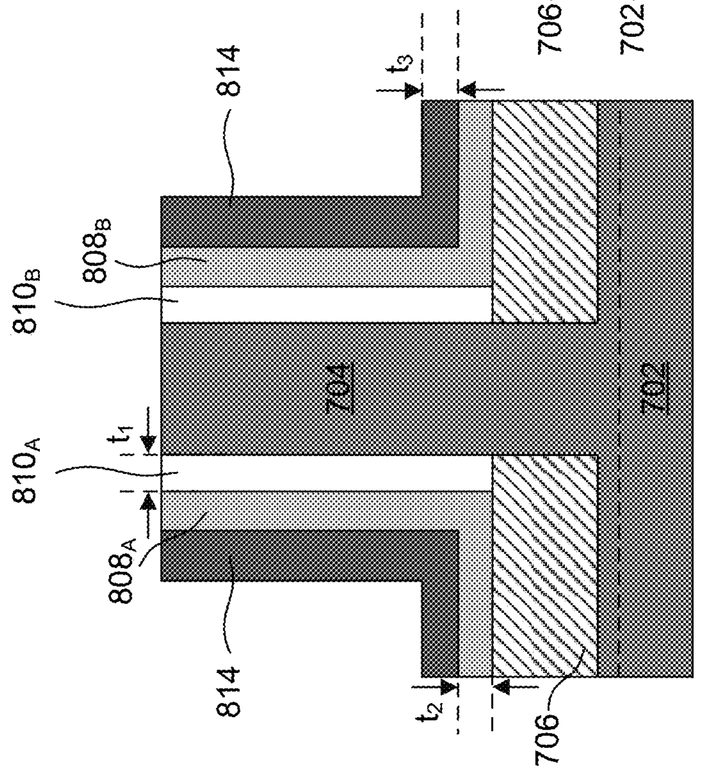

FIGS. 10A-10B show respective cross-sectional and isometric views of the partially fabricated double-gate transistor 700 after a planarization process. FIG. 10A is the cross-sectional view of fin-based double-gate transistor 700 taken along the vertical cut 731 shown in FIG. 10B. The planarization process can be performed on the partially fabricated double-gate transistor 700 as described with references to FIGS. 8B and 9B. The planarization process can include a chemical mechanical polish (CMP) process that provides a high selectivity between the material of hard mask 708 and the material of fin 704, in some embodiments. For example, the planarization process can have a high selectivity of silicon nitride to silicon. Thus, the planarization process is capable of removing hard mask 708 and portions of first gate electrode layer 814, sheet layer 810, and insulator layer 808. The top surface of fin 704 provides an end point to the polishing process, therefore the planarization process proceeds until a top surface of fin 704 is reached or exposed. The selectivity of the planarization process can be controlled by applying a suitable polishing solution that is abrasive and/or chemically reactive (e.g., slurry) during the polishing process. After the planarization process, sheet layer 810 can be divided into two separate portions, first and second sheet layers $\mathbf{810}_A$ and $\mathbf{810}_B$. Similarly, insulator layer 808 can be divided into two separate portions, first and second insulator layers $\mathbf{808}_A$ and $\mathbf{808}_B$.

Figure 11B:
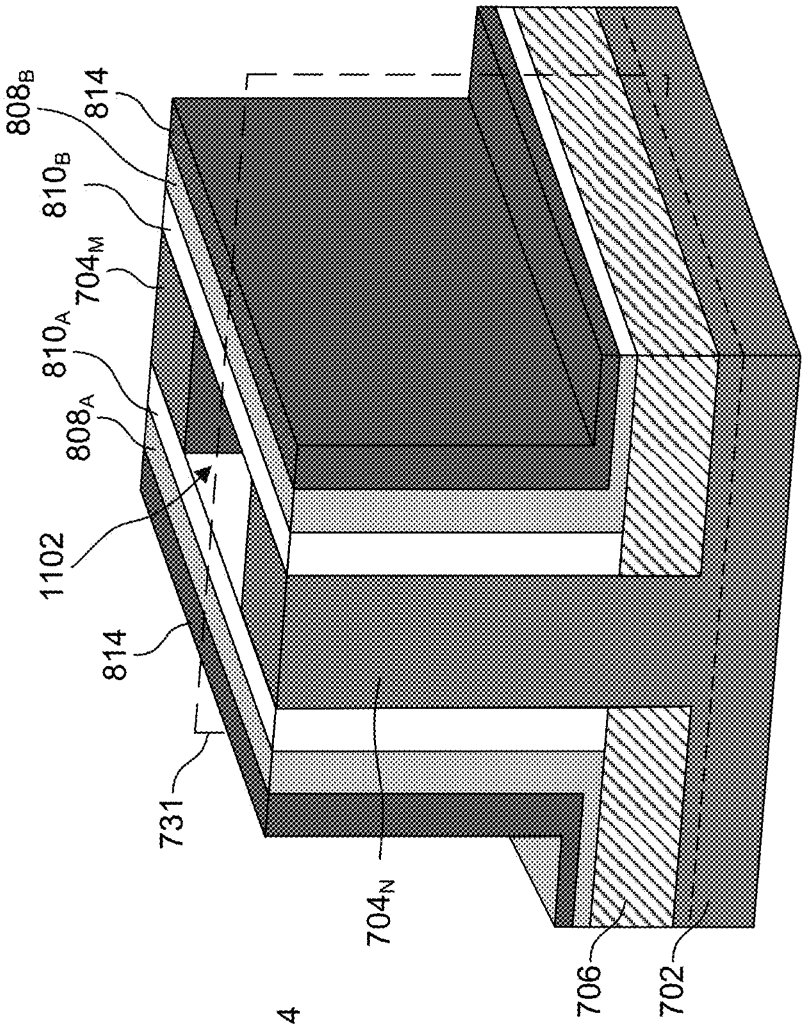
FIGS. 11A-11B show respective cross-sectional and isometric views of a partially fabricated double-gate semiconductor structure after removing a portion of a fin, in accordance with some embodiments.
Figure 11A:
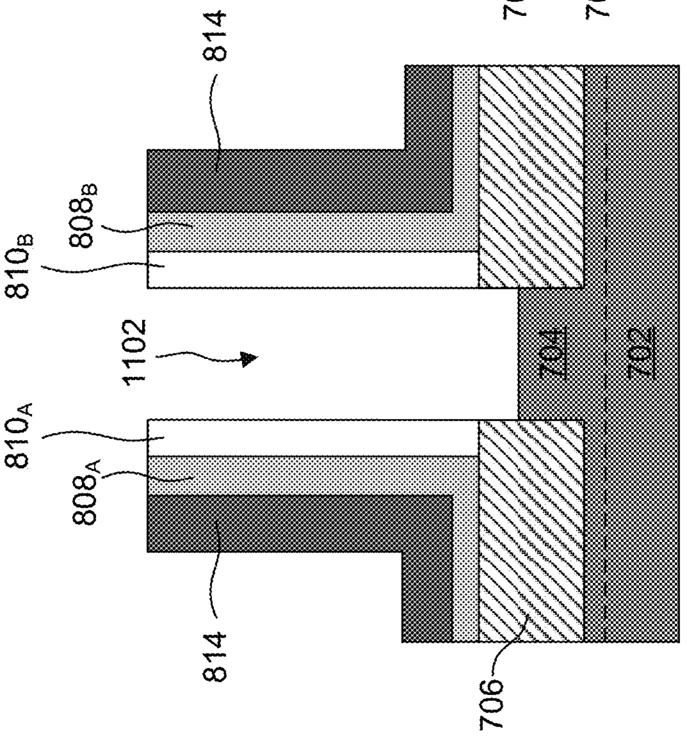

FIGS. 11A-11B show respective cross-sectional and isometric views of the partially fabricated double-gate transistor 700 after forming a recess in fin 704. By removing a portion of fin 704 that is between opposing sidewalls of first and second sheet layers $\mathbf{810}_A$ and $\mathbf{810}_E$ respectively, recess 1102 is formed in fin 704 and exposes portions of first and second sheet layers $\mathbf{810}_A$ and $\mathbf{810}_B$. Recess 1102 divides portions of fin 704 that are above the bottom of the recess into two portions $\mathbf{704}_M$ and $\mathbf{704}_N$. First and second sheet layers $\mathbf{810}_A$ and $\mathbf{810}_B$ extend continuously from respective sidewalls of the two portions $\mathbf{704}_M$ and $\mathbf{704}_N$ of fin 704. FIG. 11A is a cross-sectional view of FIG. 11B according to the vertical cut 731 illustrated in FIG. 11B. With reference to FIG. 11A, the width of recess 1102 is measured between opposing sidewalls of first and second sheet layers $\mathbf{810}_A$ and $\mathbf{810}_B$ and can be equal to the width of fin 704. The length of recess 1102 can be equal to a desired channel length of the double-gate transistor 700. Recess 1102 is formed by removing a portion of fin 704 using suitable processes such as, for example, photolithography and etch processes. The photolithography process can include forming a photoresist layer overlying the partially fabricated double-gate transistor 700, exposing the resist to a pattern, performing post-exposure bake processes, and developing the resist to form a masking element. The masking element can be used to protect regions of the structure while an etch process removes at least a portion of fin 704 and form recess 1102 between the remaining portion of fin 704 and opposing first and second sheet layers $\mathbf{810}_A$ and $\mathbf{810}_B$. The etching process can include any suitable etching technique, and in some embodiments, can include etching technique such as, for example, dry etching, wet etching, reactive ion etching, and/or other etching methods (e.g., an RIE process). As shown in FIG. 11A, the etch process proceeds until the bottom surface of recess 1102 is between the top and bottom surfaces of isolation structure 706. In some embodiments, the bottom surface of recess 1102 is above the top surface of isolation structure 706.

Figure 12B:
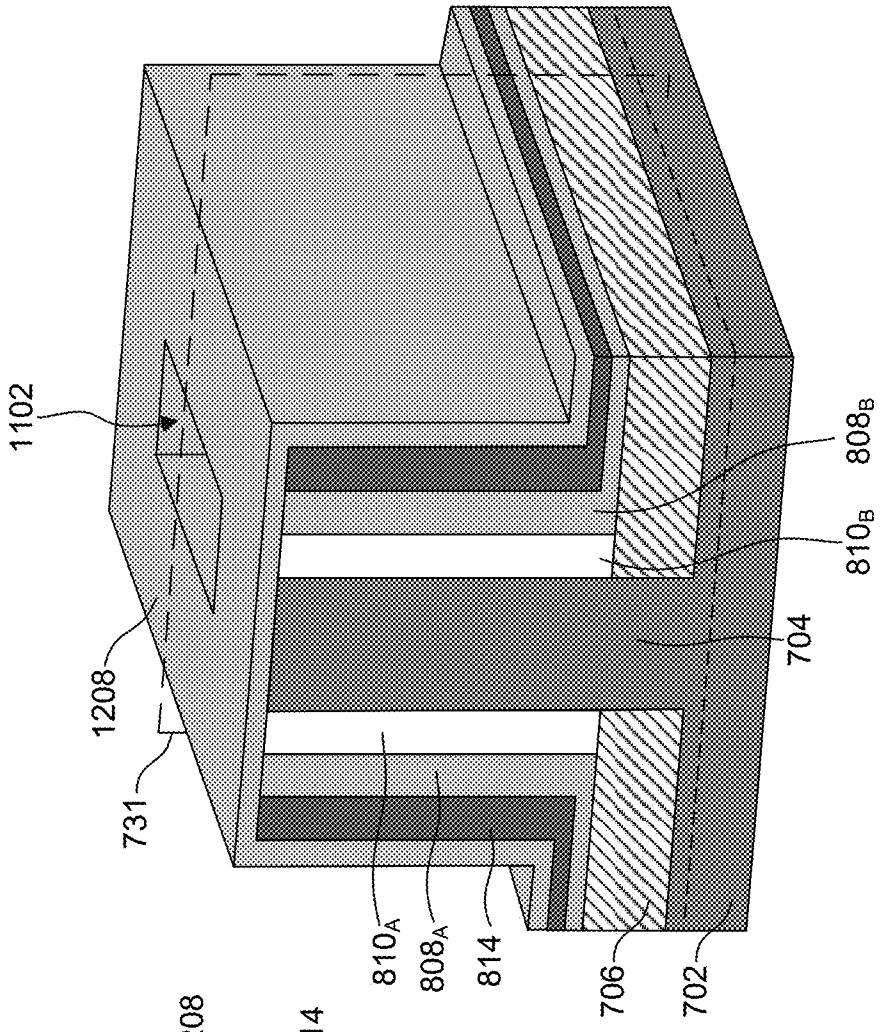
FIGS. 12A-12B show respective cross-sectional and isometric views of a partially fabricated double-gate semiconductor structure after deposition of a gate insulator layer, in accordance with some embodiments.
Figure 12A:
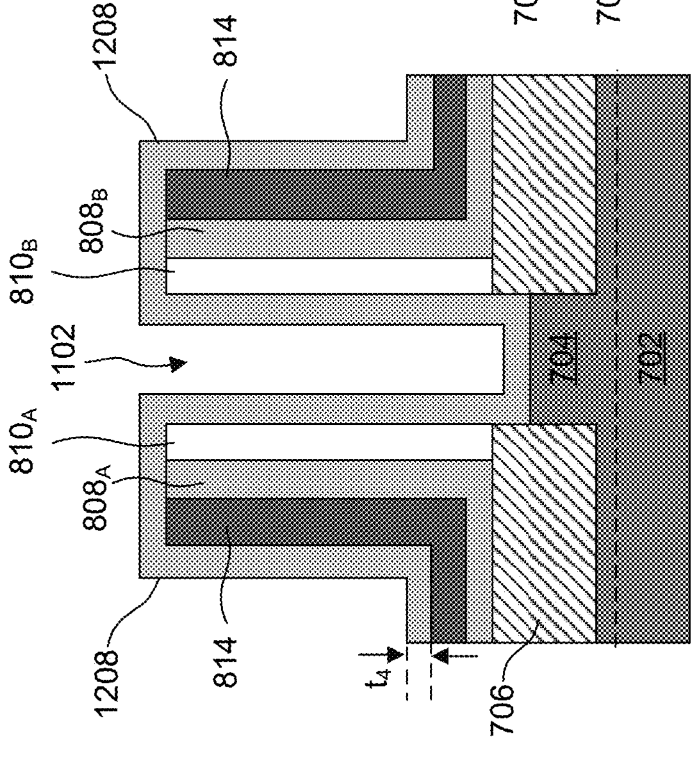

FIGS. 12A-12B show respective cross-sectional and isometric views of the partially fabricated fin-based double-gate transistor 700 after forming a second gate insulator layer 1208. FIG. 12A is a cross-sectional view of FIG. 12B according to the vertical cut 731 illustrated in FIG. 12B. FIG. 12A shows second gate insulator layer 1208 can be formed over the partially formed fin-based double-gate transistor structure described with reference to FIG. 11A. Second insulator layer 1208 can be disposed over exposed surfaces of partially fabricated fin-based double-gate transistor 700 that includes fin 704, first and second sheet layers $\mathbf{810}_A$ and $\mathbf{810}_B$, first and second insulator layers $\mathbf{808}_A$ and $\mathbf{808}_B$. As shown in FIGS. 12A and 12B, second gate insulator layer 1208 can be formed on the exposed surfaces of fin 704 and first and second sheet layers $\mathbf{810}_A$ and $\mathbf{810}_B$ in recess 1102, in some embodiments. Second gate insulator layer 1208 can be formed by depositing an insulator material on partially fabricated fin-based double-gate transistor 700. Second gate insulator layer 1208 can be formed using the same material as insulator layer 808. For example, second gate insulator layer 1208 can include one or more of silicon dioxide, silicon nitride, and high-k dielectric materials. In some embodiments, second gate insulator layer 1208 can include materials different from insulator layer 808. In some embodiments, the thickness $t_4$ of second gate insulator layer 1208 is in a range of about 1 nm to about 10 nm.

Figure 13B:
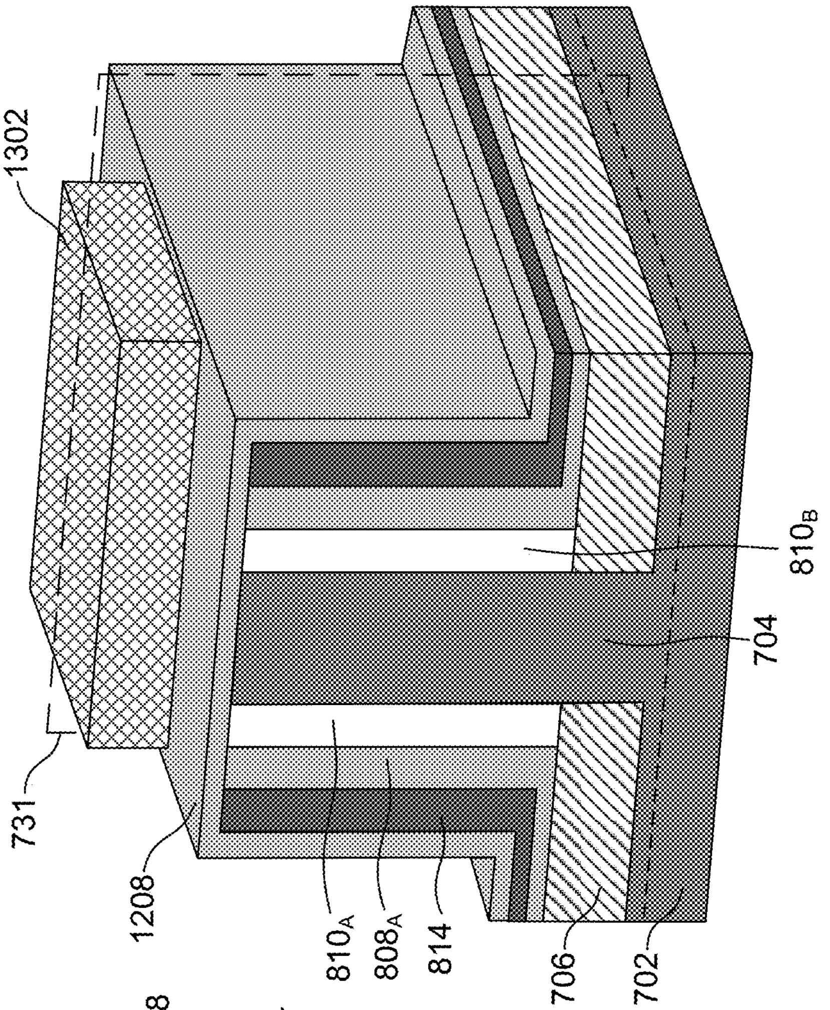
FIGS. 13A-13B show respective cross-sectional and isometric views of a partially fabricated double-gate semiconductor structure after formation of a masking layer, in accordance with some embodiments.
Figure 13A:
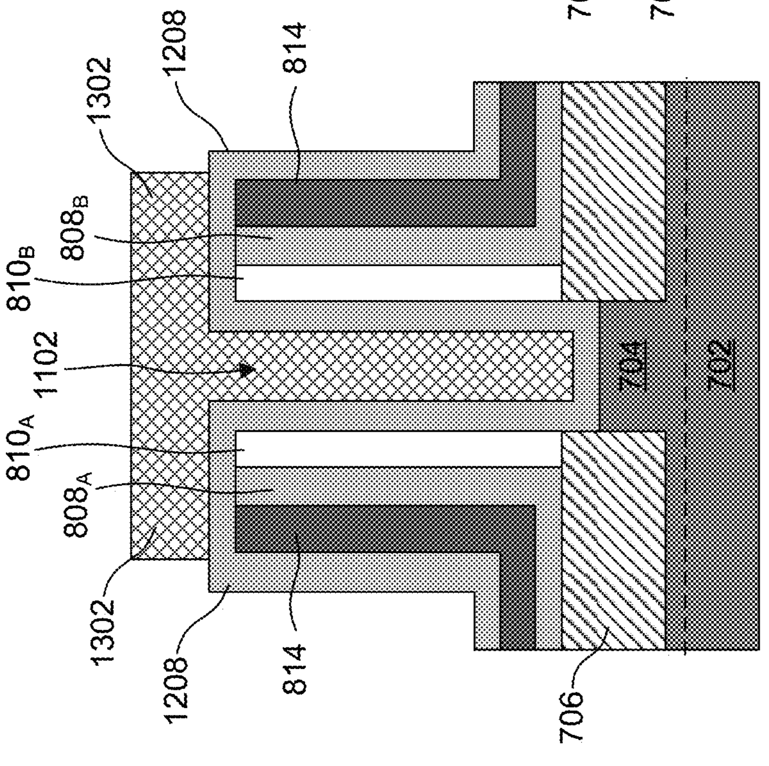

FIGS. 13A-13B show respective cross-sectional and isometric views of the partially fabricated fin-based double-gate transistor 700 after forming a masking layer. FIG. 13A is a cross-sectional view of FIG. 13B according to the vertical cut 731 illustrated in FIG. 13B. FIG. 13A shows a masking layer 1302 can be formed over the partially formed fin-based double-gate transistor structure described with reference to FIG. 12A. Specifically, as seen from FIG. 13A, masking layer 1302 can be a T-shaped structure that fills recess 1102 and overflows to form on a portion of the top surfaces of second gate insulator layer 1208. Masking layer 1302 can be used to protect second gate insulator layer 1208 that is formed in recess 1102. In some embodiments, opposing surfaces of first and second sheet layers $\mathbf{810}_A$ and $\mathbf{810}_B$ are separated by a greater distance, and recess 1102 may not be filled entirely by masking layer 1302. Masking layer 1302 can include any suitable material such as, for example, a photoresist layer which can be formed by a photolithography process, in accordance to some embodiments. The photolithography process can include disposing a photoresist layer, exposing the photoresist layer to a pattern, performing post-exposure bake processes, and developing the resist to form a patterned photoresist. In some embodiments, the composition of masking layer 1302 can be similar to hard mask 708 and include a dielectric material such as, for example, silicon nitride, SiON, SiC, SiOC, SOG, a low-k film, or silicon oxide.

Figure 14B:
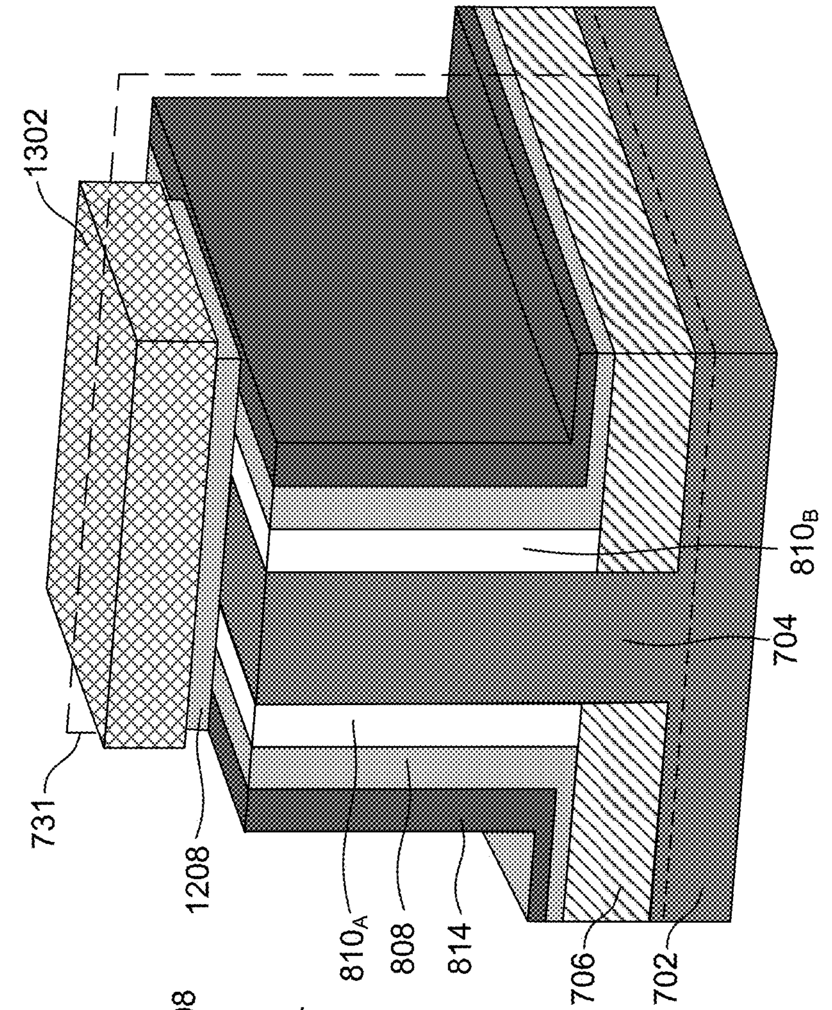
FIGS. 14A-14B show respective cross-sectional and isometric views of a partially fabricated double-gate semiconductor structure after etching gate insulator layer using a masking layer, in accordance with some embodiments.
Figure 14A:
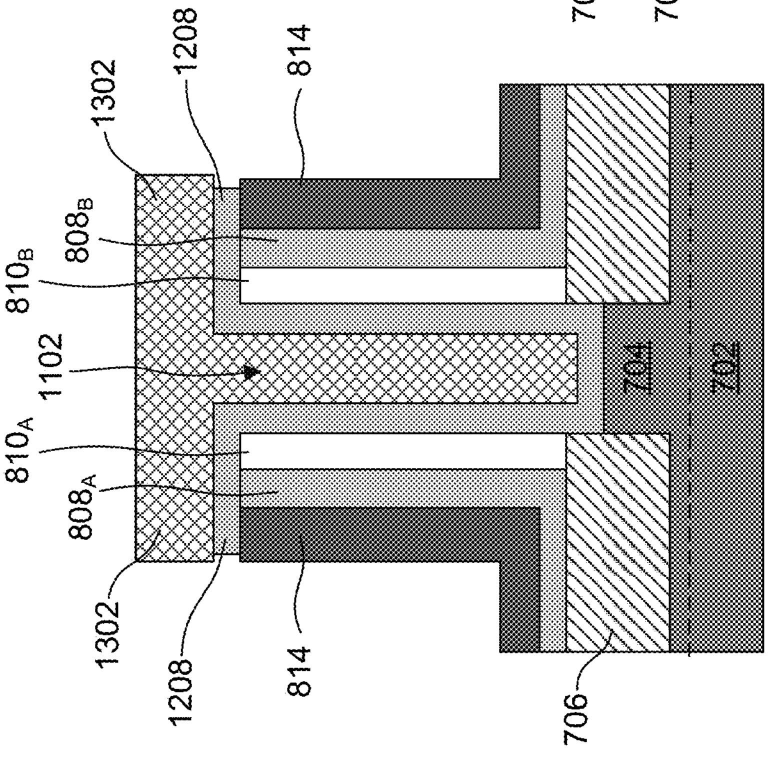

FIGS. 14A-14B show respective cross-sectional and isometric views of the partially fabricated fin-based double-gate transistor 700 after etching second gate insulator layer 1208 using the masking layer 1302. FIG. 14A is a cross-sectional view of FIG. 14B according to the vertical cut 731 illustrated in FIG. 14B. Exposed second gate insulator layer 1208 that is not protected by masking layer 1302 can be etched using suitable etching processes such as, for example, an RIE process or a chemical wet etching process. The masking layer 1302 can protect the second gate insulator layer 1208 underneath it from being etched and the etching process proceeds until the exposed second gate insulator layer 1208 is completely removed, in some embodiments. More specifically, the top horizontal portions of second gate insulator layer 1208 can cover portions of the top surfaces of respective first and second sheet layers $\mathbf{810}_A$ and $\mathbf{810}_B$, first and second insulator layers $\mathbf{808}_A$ and $\mathbf{808}_B$, and first gate electrode layer 814. These top surfaces are protected by second gate insulator layer 1208 during the etching process. In some embodiments, over etching of second gate insulator layer 1208 can occur during the etching process, and second gate insulator layer 1208 should at least cover portions of the top surfaces of first and second sheet layers $\mathbf{810}_A$ and $\mathbf{810}_B$.

Figure 15B:
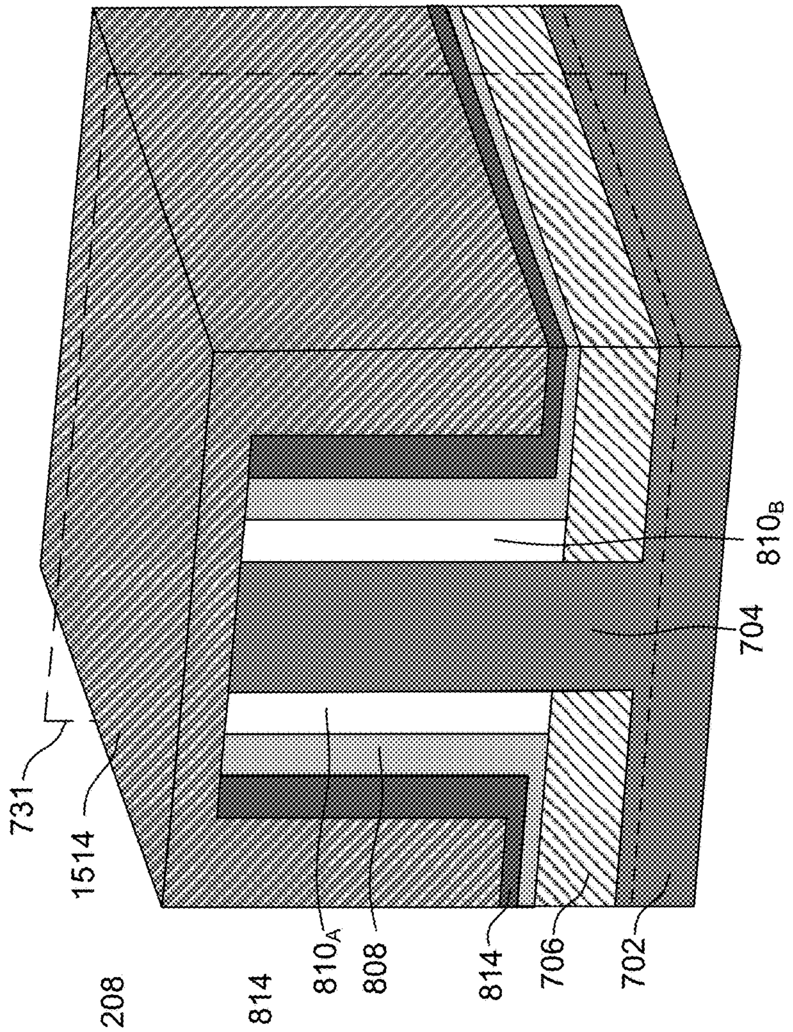
FIGS. 15A-15B show respective cross-sectional and isometric views of a partially fabricated double-gate semiconductor structure after removing a masking layer and depositing a gate electrode layer, in accordance with some embodiments.
Figure 15A:
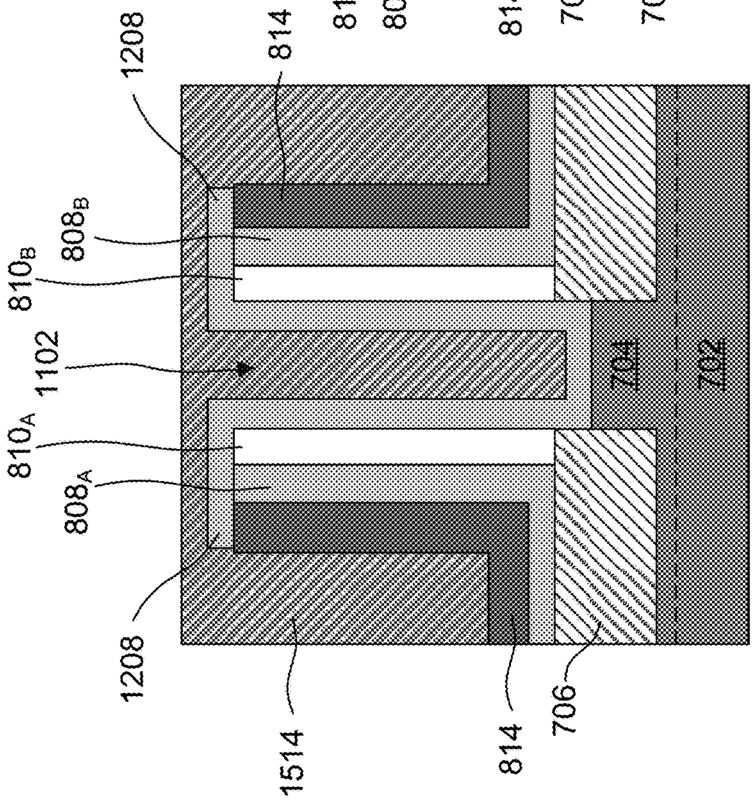

FIGS. 15A-15B show respective cross-sectional and isometric views of the partially fabricated double-gate transistor 700 after removing the masking layer 1302 and depositing a second gate electrode layer. FIG. 15A is a cross-sectional view of FIG. 15B according to the vertical cut 731 illustrated in FIG. 15B. Masking layer 1302 can be completely removed from the partially fabricated double-gate transistor 700 using suitable removal processes. In some embodiments where masking layer 1302 includes photoresist layers, it can be removed by an ashing process. This process usually requires a liquid "resist stripper", which chemically alters or dissolves the photoresist so that it no longer adheres to second gate insulator layer 1208. In some embodiments, masking layer 1302 can be removed by a plasma containing oxygen. Other removal process such as RIE etching or chemical wet etching can be used when appropriate. The removal of masking layer 1302 exposes recess 1102, and after masking layer 1302 is removed a second gate electrode layer 1514 can be deposited over the entire exposed surface of partially fabricated double-gate transistor 700, including in recess 1102. The material composition of second gate electrode layer 1514 can be similar to first gate electrode layer 814 and deposited using similar methods. For example, the deposition of a second gate electrode layer 1514 can include CVD, PVD, ALD, MBE, HDPCVD, MOCVD, RPCVD, PECVD, plating, other suitable methods, and/or combinations thereof. In some embodiments, the composition of second gate electrode 1514 can be different from the composition of first gate electrode layer 814. In some embodiments, second gate electrode layer 1514 can include suitable conductive materials such as, for example, aluminum, tungsten, copper, and/or other suitable materials.

Figure 16B:
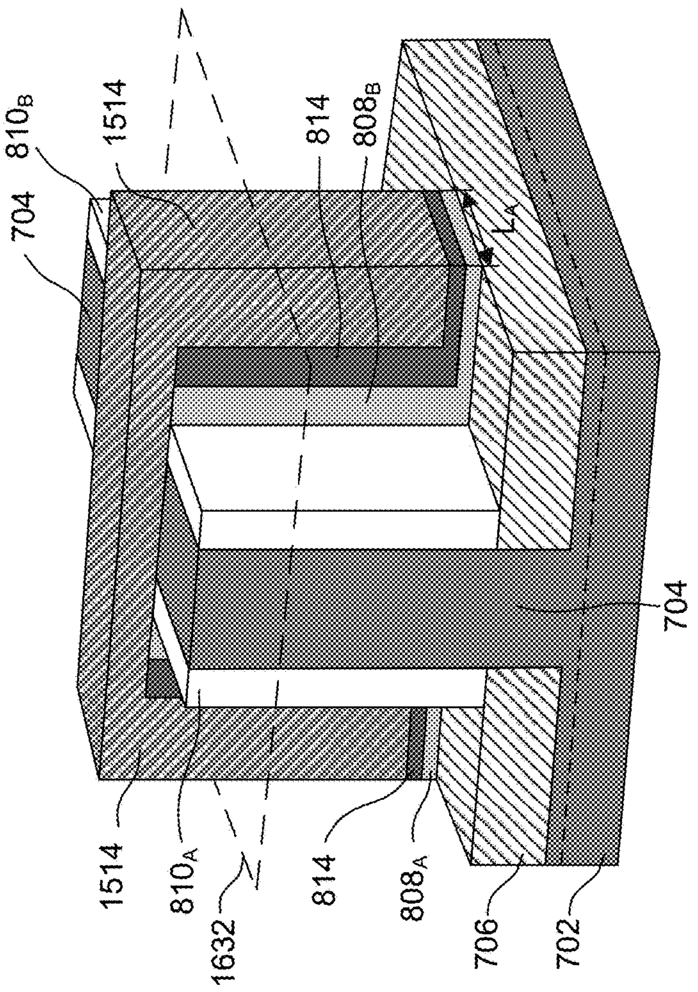
FIGS. 16A-16B show respective cross-sectional and isometric views of a partially fabricated double-gate semiconductor structure after removing portions of a gate insulator layer and gate electrode layers, in accordance with some embodiments.
Figure 16A:
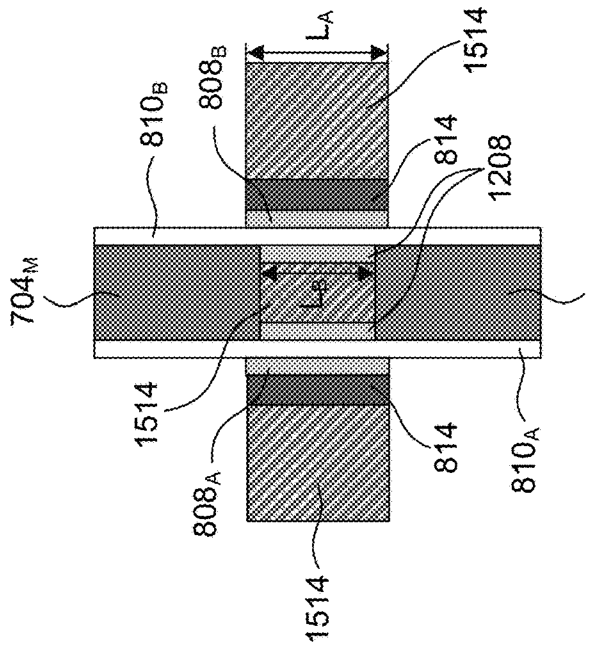

FIGS. 16A-16B show respective cross-sectional and isometric views of the partially fabricated fin-based double-gate transistor 700 after removing portions of the first and second gate electrode layers as well as the second gate insulator layer to form gate electrodes. FIG. 16A is a cross-sectional view of FIG. 16B according to a horizontal cut 1632 illustrated in FIG. 16B. As shown in FIGS. 16A-16B, portions of first gate electrode layer 814, second gate electrode layer 1514, and first and second insulator layers $808_A$ and $808_B$ can be removed by suitable etching processes, in accordance with some embodiments. With reference to FIG. 16A, the removal process can be configured such that after the removal process, the remaining first gate electrode layer 814, second gate electrode layer 1514, and first and second insulator layers $808_A$ and $808_B$ would share the same length $L_A$. Length $L_A$ can be approximately equal to or larger than length $L_B$ which is the length of recess 1102 or the separation measured between the opposing vertical surfaces of remaining fins 704. Length $L_A$ can be equal to a desired outer gate electrode length of the double-gate transistor 700, in some embodiments. The removal process includes photolithography and etch processes, and can begin by forming a photoresist layer overlying the partially fabricated double-gate transistor 700, exposing the resist to a pattern, performing post-exposure bake processes, and developing the resist to form a masking element. The masking element can be used to protect regions of the structure while an etch process removes portions of second gate electrode layer 1514, first gate electrode layer 814, and first and second insulator layers $808_A$ and $808_B$. As shown in FIG. 16B, the etching process can proceed until at least portions of the top surfaces of isolation structures 706 and fins 704 are exposed, as well as portions of the sidewalls of first and second sheet layers $810_A$ and $810_B$. The etching process can include any suitable etching technique, and in some embodiments, can include dry etching, wet etching, reactive ion etching, and/or other etching methods (e.g., an RIE process). As the gate electrode layer and gate insulator layer include different types of materials, multiple etching processes can be used accordingly.

Figure 17B:
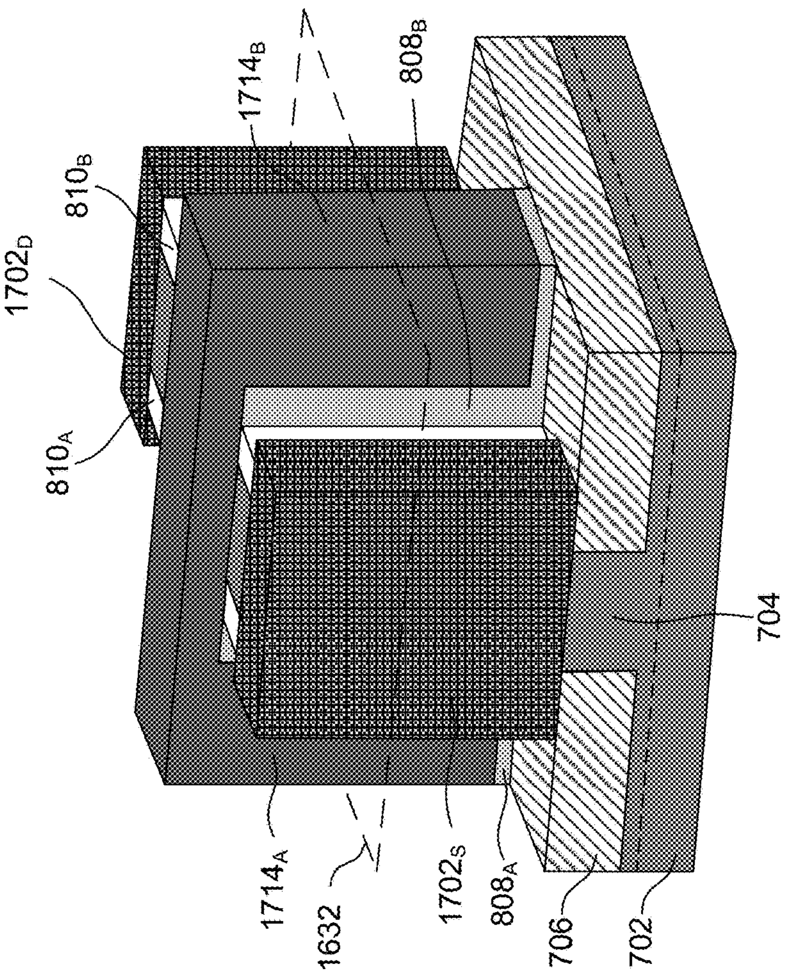
FIGS. 17A-17B show respective cross-sectional and isometric views of a partially fabricated double-gate semiconductor structure after forming metallic source and drain terminals, in accordance with some embodiments.
Figure 17A:
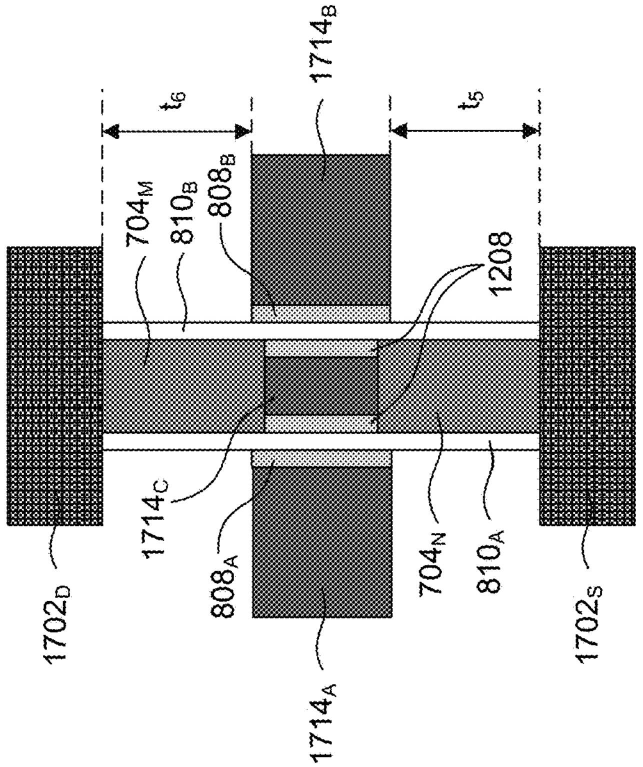

FIGS. 17A-17B show respective cross-sectional and isometric views of the partially fabricated double-gate transistor 700 after source and drain metallization. FIG. 17A is a cross-sectional view of FIG. 17B according to the horizontal cut 1632 illustrated in FIG. 17B. For ease of description, a source terminal is referred to as source region $1702_S$ and a drain terminal is referred to as drain region $1702_D$. A person of ordinary skill in the art will recognize that the source and drain regions $1702_S$ and $1702_D$ are interchangeable and can be formed on, and/or surrounding portions of exposed first and second sheet layers $810_A$ and $810_B$ and fins 704 that are on opposing sides of second gate electrode 1514. S/D regions $1702_S$ and $1702_D$ include metallic material such as, for example, nickel, cobalt, tantalum, titanium, platinum, erbium, palladium, aluminum, and/or tungsten. The metal can be deposited using deposition processes such as PVD, ALD, CVD, PECVD, APCVD, LPCVD, HDPCVD, or ALCVD. After deposition, S/D regions $1702_S$ and $1702_D$ can be defined using photolithography and etching processes, in some embodiments. The photolithography process can include forming a photoresist layer, exposing the resist to a pattern, performing post-exposure bake processes, and developing the resist to form a masking element including the resist. The masking element can be used to protect regions of the metal layer while an etch process removes the metal layer from unprotected regions. The metal layer can be etched using RIE, chemical wet etching, and/or other suitable processes. The S/D regions and the channel region are physically separated to prevent shorting. For example, a distance $t_5$ between source region $1702_S$ and gate electrode layer 1714 is in a range of about 1 nm and 10 nm. Similarly, a distance $t_6$ between drain region $1702_D$ and gate electrode layer 1714 is in a range of about 1 nm and 10 nm. Distances $t_5$ and $t_6$ can be similar or different, depending on device structure and needs.

In some embodiments, the S/D features are formed by epitaxially growing a semiconductor material layer in the S/D regions. In some embodiments, sacrificial sidewall spacers can be formed prior to epitaxial S/D growth and removed after epitaxial S/D growth. In some embodiments, the semiconductor material layer grown in the S/D regions includes Ge, Si, GaAs, AlGaAs, SiGe, GaAsP, SiP, or other suitable material. The S/D features can be formed by one or more epitaxial processes. In some embodiments, the S/D features can be in-situ doped during the epitaxial process. For example, in some embodiments, epitaxially grown SiGe S/D features can be doped with boron. In some embodiments, epitaxially grown Si epitaxial S/D features can be doped with carbon to form Si:C S/D features, phosphorous to form Si:P S/D features, or both carbon and phosphorous to form SiCP S/D features. In some embodiments, the S/D features are not in-situ doped, and instead an implantation process is performed to dope the S/D features. S/D regions $1702_S$ and $1702_D$ can have various cross-section shapes such as, for example, square, rectangle, pentagon, and/or other suitable shapes thereof.

The various fabrication stages described with references to FIGS. 7A-17B are directed to the formation of double-gate transistor 700 which is a fin-based structure incorporating 2-D materials. The two gate structures of the double-gate structure each includes an outer gate electrode region, an inner gate electrode region, gate oxide layers, and channel regions incorporating 2-D materials.

For the ease and clarity of describing the fin-based double-gate transistor, first gate electrode layer 814 and second gate electrode layer 1514 described with reference to FIGS. 16A-16B above can be considered here as one gate electrode layer 1714 because they are physically and electrically connected and include identical or similar materials. Further, merely for the ease and clarity of description, gate electrode layer 1714 can be divided into multiple regions depending on their relative position with first and second sheet layers $810_A$ and $810_B$. Similarly, gate insulator layer 808 can be divided into multiple regions. Outer surfaces of sheet layer 810 are the vertical surfaces that face away and are not in direct contact with fins 704, while inner surfaces of first and second sheet layers $810_A$ and $810_B$ are the vertical surfaces that are in direct contact with fins 704 and recess 1102. As shown in FIG. 17A, $808_A$ and $808_B$ are outer gate insulator regions that are in contact with and covers a portion of the outer surfaces of first and second sheet layers $810_A$ and $810_B$. Similarly, $1714_A$ and $1714_B$ are the vertical outer gate electrode regions of gate electrode layer 1714 that are in contact with outer gate insulator regions $808_A$ and $808_B$, respectively. Inner gate insulator regions can be portions of second gate insulator layer 1208 that are formed in recess 1102 and cover inner surfaces of first and second sheet layers $810_A$ and $810_B$. Inner gate electrode region $1714_C$ can be a portion of the gate electrode layer 1714 that is formed in recess 1102 and placed between second gate insulator layers 1208 and opposing fins 704. Second gate insulator layer 1208 and inner gate electrode region 1714$_C$ are not visible in FIG. 17B.

A first gate structure of double-gate transistor 700 can include respective inner and outer gate electrode regions 1714$_C$ and 1714$_A$, second gate insulator layer 1208, outer gate insulator region 808$_A$, and a channel region that is located in first sheet layer 810$_A$ between second gate insulator layer 1208 and outer gate insulator region 808$_A$.

A second gate structure of double-gate transistor 700 can include respective inner and outer gate electrode regions 1714$_C$ and 1714$_B$, second gate insulator layer 1208, outer gate insulator region 808$_B$, and a channel region that is located in second sheet layer 810$_B$ between second gate insulator layer 1208 and outer gate insulator region 808$_B$.

Although inner and outer gate electrode regions 1714$_C$, 1714$_A$, and 1714$_B$ are discussed separately, they are physically and electrically connected. The gate electrodes wrap around the channel region for each gate structure of fin-based double-gate transistor 700, thus there can be a gate on each side of the channel region allowing gate control from both sides, in accordance with some embodiments.

Figure 18:
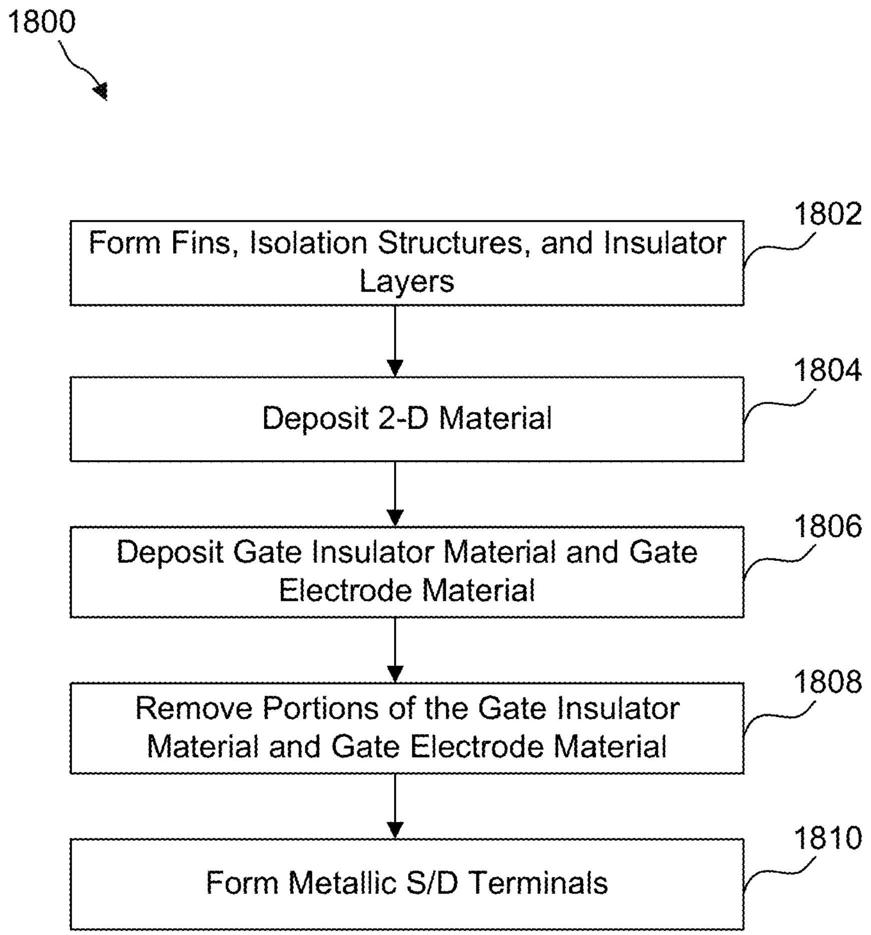
FIG. 18 is a flow diagram illustrating an exemplary method for fabricating a semiconductor structure incorporating 2-D material, in accordance with some embodiments.

FIG. 18 is a flow diagram of an example method 1800 of forming fin-based structure incorporating 2-D materials, according to some embodiments. Based on the disclosure herein, a person of ordinary skill in the art will recognize that other operations in method 1800 can be performed. Further, a person of ordinary skill in the art will recognize that the operations of method 1800 can be performed in a different order and/or vary.

At operation 1802, raised features and layers are formed on and/or within a semiconductor structure. The semiconductor structure can include bulk silicon (e.g., doped or undoped silicon), or an active layer of a silicon-on-insulator (SOI) substrate. The semiconductor structure can include semiconductor material such as, for example, silicon, germanium, silicon germanium, silicon germanium on insulator (SGOI), or combinations thereof. Active devices can be formed on and/or within the semiconductor substrate. Active and passive devices such as, for example, transistors, diodes, capacitors, resistors, inductors, and the like can be formed.

In some embodiments, the semiconductor structure includes isolation structures, insulator layers, and/or raised features such as, for example, fins. Fins can be fabricated using suitable processes including photolithography and etch processes. Isolation structures can be made of a dielectric material and can include a multi-layer structure such as, for example, a structure having one or more liner layers. In some embodiments, an optional insulator layer can be formed by depositing an insulator material and performing subsequent photolithography and etching processes.

At operation 1804, a 2-D material is deposited over the semiconductor structure. The deposition of 2-D material can form a sheet layer on the isolation structure and insulator layers (formed in operation 1802). In some embodiments, the sheet layer thickness can be a single molecule layer thickness. With this thickness, the sheet layer can maintain sufficient carrier mobility. In some embodiments, the sheet layer can include one or more monolayers of graphene, a sheet based carbon structure, where each sheet is a single atom in thickness. The 2-D material sheet layer can be formed using suitable deposition methods, including but not limited to epitaxial growth, annealing SAM layers, ALD, CVD, PEVCD, MBE, or metal deposition with subsequent chemical reaction.

At operation 1806, a gate insulator material and a gate electrode material are deposited over the semiconductor structure. The gate insulator material is disposed over an exposed portion of the sheet layer. The gate insulator material can be formed by depositing an insulator material through suitable deposition processes such as, for example, through CVD, PECVD, ALD, or MBE. The gate insulator layer can include dielectric materials such as, for example, one or more of silicon dioxide, silicon nitride, and high-k dielectric materials. The gate electrode material is formed over the gate insulator layer. The gate electrode material can be a polysilicon layer or a metallic layer. Deposition methods of a suitable gate material to form a gate electrode layer can include CVD, PVD, ALD, MBE, HDPCVD, MOCVD, RPCVD, PECVD, plating, other suitable methods, and/or combinations thereof.

At operation 1808, portions of the gate electrode material and the gate insulator material are removed from the semiconductor structure. These materials can be removed by etching processes, which can begin with a photolithography process to expose a portion of the gate insulator layer and the gate electrode material to be etched. The etching can include any suitable etching technique such as, for example, dry etching, wet etching, reactive ion etching, and/or other etching methods. In some embodiments, the semiconductor structure can be a fin-based transistor, where the remaining gate insulator material and gate electrode material can form a gate stack of the fin-based transistor. Further, the portion of the sheet layer under the remaining gate insulator material and the gate electrode material can form a channel region of the fin-based transistor.

At operation 1810, S/D terminals of the semiconductor structure are formed. The S/D terminals are formed on and/or formed on surrounding portions of the exposed sheet layer. The S/D terminals can include metallic material such as, for example, nickel, cobalt, tantalum, titanium, platinum, erbium, palladium, and/or tungsten. The metal can be deposited using processes such as, for example, PVD, CVD, PECVD, APCVD, LPCVD, HDPCVD, or ALCVD. After deposition, the S/D terminals are defined using photolithography and etching processes. The metal layer can be etched using RIE, chemical wet etching, and/or other suitable processes.

Figure 19:
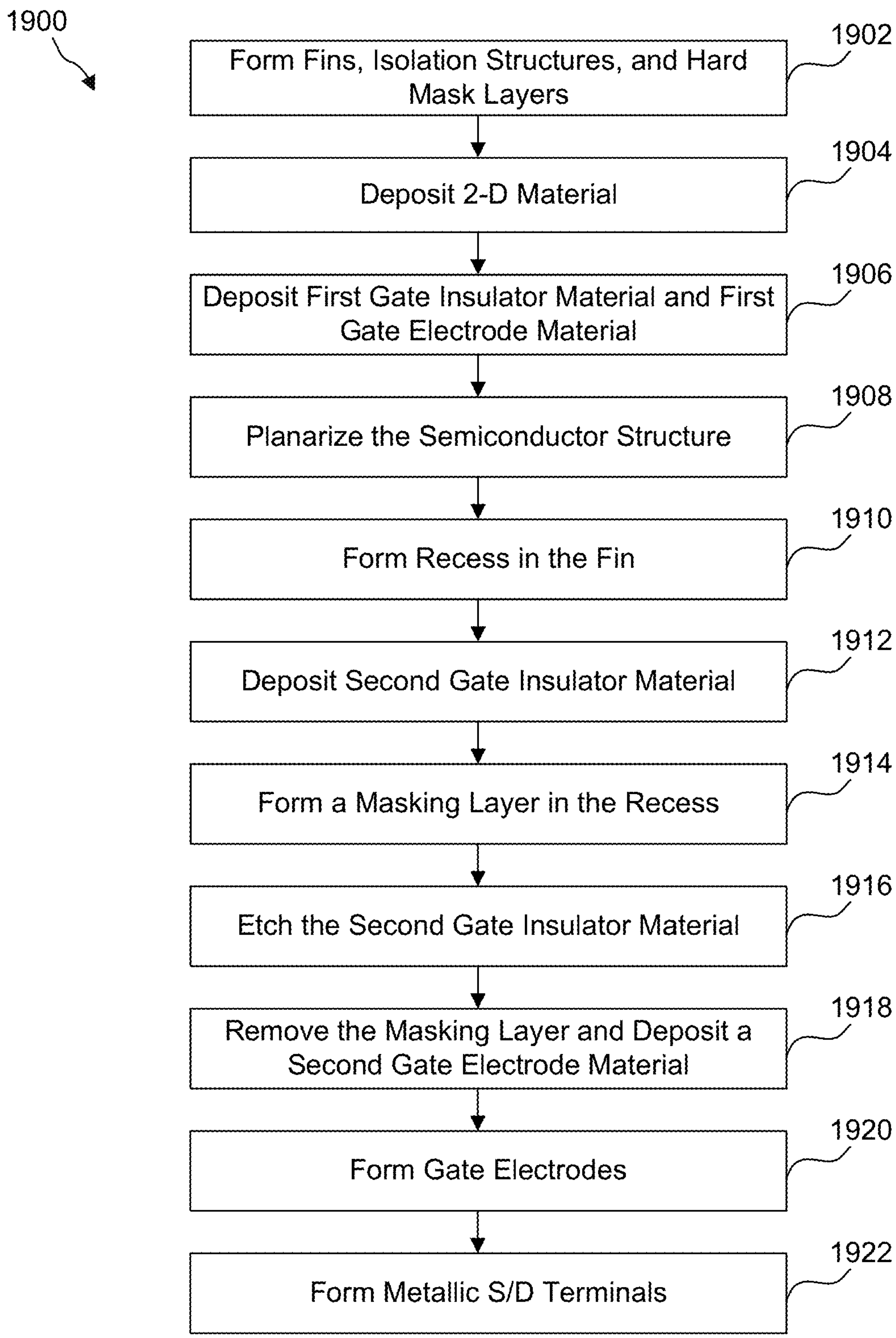
FIG. 19 is a flow diagram illustrating an exemplary method for fabricating a double-gate semiconductor structure incorporating 2-D material, in accordance with some embodiments.

FIG. 19 is a flow diagram of an example method 1900 of forming fin-based double-gate structure incorporating 2-D materials, according to some embodiments. Based on the disclosure herein, a person of ordinary skill in the art will recognize that other operations in method 1900 can be performed. Further, a person of ordinary skill in the art will recognize that the operations of method 1900 can be performed in a different order and/or vary.

At operation 1902, raised features and layers are formed on and/or within a semiconductor structure. The semiconductor structure can include bulk silicon (e.g., doped or undoped silicon), or an active layer of an SOI substrate. The semiconductor structure can include semiconductor material such as, for example, silicon, germanium, silicon germanium, silicon germanium on insulator (SGOI), or combinations thereof. Active devices can be formed on and/or within the semiconductor substrate. Active and passive devices such as, for example, transistors, diodes, capacitors, resistors, inductors and the like can be formed.

In some embodiments, the semiconductor structure includes isolation structures, hard mask layers, and/or raised features such as, for example, fins. Fins can be fabricated using suitable processes including photolithography and etch processes. A hard mask layer can be used to protect the fin structures during the etching process. Isolation structures can be made of a dielectric material and can include a multi-layer structure such as, for example, structures with one or more liner layers.

At operation 1904, a 2-D material is deposited over the semiconductor structure. In some embodiments, the 2-D material sheet layer can be deposited on the exposed surfaces of the fin structures. The sheet layer can incorporate any suitable 2-D material such as, for example, thin layers of graphene, graphene analogues, phosphorene, or TMDs. Sheet layer can be formed using suitable deposition methods such as, for example, epitaxial growth, SAM layer growth and annealing, ALD, CVD, PEVCD, MBE, or metal deposition with subsequent chemical reaction. In some embodiments, the application of adhesive layers on the exposed fin surfaces can promote the adherence of 2-D material sheet layer on the exposed fin surfaces. The 2-D material sheet layer can be formed on a separate backing material and adhered to exposed fin surfaces, followed by removing the backing material while leaving the 2-D material sheet layer on the fin.

The 2-D material sheet layer can also be formed through an etch back process, in accordance with some embodiments. 2-D material sheet layer can be deposited on exposed surfaces of the semiconductor structure using suitable deposition methods such as, for example, epitaxial growth, SAM layer growth and annealing, ALD, CVD, PEVCD, MBE, or metal deposition with subsequent chemical reaction. The 2-D material sheet layer can be etched back such that it remains on the at least the exposed fin surfaces. In some embodiments, a 2-D material sheet layer can be formed on a separate backing material and adhered to exposed areas of the fin, followed by removing the backing material while 2-D material sheet layer remains on desired areas of fin 704. Excessive 2-D material sheet layer formed on the top surfaces of isolation structure and the hard mask can be removed via suitable etching processes such as, for example, an RIE process. The RIE process can be an anisotropic etch process with higher etching speed in the vertical direction that is along the height of the fin. Therefore, the 2-D material can be selectively removed from the top surfaces of isolation structure and hard mask, leaving sufficient 2-D material to cover the exposed side walls of the fins.

At operation 1906, a first gate insulator material and a first gate electrode material are deposited sequentially over exposed surfaces of the semiconductor structure. The first gate insulator material is disposed over the exposed sheet layer and hard mask. The first gate insulator material can be formed by depositing an insulator material through suitable deposition methods such as, for example, CVD, PECVD, ALD, or MBE. The first gate insulator layer can include dielectric materials such as, for example, one or more of silicon dioxide, silicon nitride, and high-k dielectric materials. The gate electrode material is formed over the gate insulator layer. The gate electrode material can be a polysilicon layer or a metallic layer. Deposition methods of a suitable gate material to form the gate electrode layer can include CVD, PVD, ALD, MBE, HDPCVD, MOCVD, RPCVD, PECVD, plating, other suitable methods, and/or combinations thereof.

At operation 1908, the semiconductor structure can be planarized using a planarization process. The planarization process can be performed on the semiconductor structure and can include a chemical mechanical polish (CMP) process that provides a high selectivity between the material of the hard mask and the material of the fin, in accordance with some embodiments. For example, the planarization process can have a high selectivity of silicon nitride to silicon. Thus, the planarization process can be capable of removing the hard mask and portions of the first gate electrode material, the 2-D material sheet layer, and the first gate insulator material. The top surface of fins provides an end point of the polishing process, therefore the planarization process can proceed until top surfaces of the fins are reached or exposed. The selectivity of the planarization process can be controlled by applying a suitable polishing solution that is abrasive and/or chemically reactive during the polishing process.

At operation 1910, a recess is formed in the fin. By removing a portion of the fin that is between opposing sidewalls of the 2-D material sheet layer, a recess can be formed and exposes portions of the 2-D material sheet layer, in accordance with some embodiments. The length of the recess can be equal to the desired channel length of the later formed double-gate transistor. The recess can be formed by removing a portion of the fin using suitable processes such as, for example, photolithography and etch processes. A masking element can be used to protect regions of the structure while an etch process can remove at least a portion of the fin and form a recess between the remaining portions of the fin and opposing sidewalls of the 2-D material sheet layer. The etch process can proceed until the bottom surface of the recess is between the top and bottom surfaces of the isolation structure. In some embodiments, the bottom surface of the recess can be above the top surface of isolation structure.

At operation 1912, a second gate insulator material can be formed over the semiconductor structure. A second gate insulator material can be disposed over exposed surfaces of the semiconductor structure, including the fin, the 2-D material sheet layer, and the first gate insulator material, in accordance with some embodiments. The second gate insulator material can be formed by depositing an insulator material on the semiconductor structure. The second gate insulator material can incorporate dielectric material such as, for example, one or more of silicon dioxide, silicon nitride, and high-k dielectric materials.

At operation 1914, a masking layer can be formed in the recess and over a portion of the top surfaces of the semiconductor structure. The masking layer can fill the recess and can overflow to form on a portion of the top surfaces of second gate insulator material. The masking layer can be used to protect the second gate insulator material that is formed in the recess, and in some embodiments the recess may not be filled entirely by the masking layer. The masking layer includes any suitable material such as, for example, a photoresist layer which can be formed by a photolithography process. The photolithography process can include disposing a photoresist layer, exposing the photoresist layer to a pattern, performing post-exposure bake processes, and developing the resist to form a patterned photoresist. In some embodiments, the composition of the masking layer can be similar to a hard mask and can include a dielectric material.

At operation 1916, the second gate insulator material not protected by the masking layer can be etched. Exposed second gate insulator material that is not protected by the masking layer can be etched using suitable etching processes such as, for example, an RIE etching process or a chemical wet etching process. The masking layer can protect the second gate insulator material underneath it from being etched and the etching process can proceed until the exposed second gate insulator material is completely etched.

At operation 1918, the masking layer can be removed and a second gate electrode material can be deposited. The masking layer can be completely removed from the semiconductor structure using suitable removal processes. If the masking layer includes photoresist layer, it can be removed by an ashing process which chemically alters the photoresist so that it no longer adheres to the second gate insulator material. In some embodiments, the masking layer can be removed by a plasma containing oxygen. Other removal process such as an RIE etching process or a chemical wet etching process can be used when appropriate. The removal process can expose the recess, and a second gate electrode material can be deposited over the entire exposed surface of the semiconductor structure, including in the recess. The material composition of the second gate electrode material can be identical or similar to the first gate electrode material and deposited using similar methods.

At operation 1920, portions of the first and second gate electrode layers as well as the first gate insulator material can be removed. The removal process can be configured such that after the removal process, the remaining first gate electrode material, the second gate electrode material, and the second gate insulator material would share the same length that can be approximately equal to or larger than the length of the recess or the separation measured between the opposing vertical surfaces of the remaining fins, in accordance with some embodiments. The removal process can include photolithography and etch processes. The etch process can proceed until at least portions of the top surfaces of the isolation structures and fins are exposed, as well as portions of the sidewalls of 2-D material sheet layer. The etching process can include any suitable etching technique such as, for example, dry etching, wet etching, reactive ion etching, and/or other etching methods.

At operation 1922, S/D terminals of the semiconductor structure can be formed. S/D terminals can be formed on, and/or surrounding portions of the exposed sheet layer and fin surfaces, and can include metallic material such as, for example, nickel, cobalt, tantalum, titanium, platinum, erbium, palladium, and/or tungsten. The metal can be deposited using conventional processes such as PVD, CVD, ALD, PECVD, APCVD, LPCVD, HDPCVD, or ALCVD. After deposition, S/D terminals can be defined using photolithography and etching processes. The metal layer can be etched using RIE, chemical wet etching, and/or other suitable processes.

The vertical structure of the double-gate transistor provides higher packing density and the sheet layer incorporating 2-D material provides outstanding electrical performance. A source/drain doping process is no longer necessary in the sheet layer since the surfaces of the 2-D materials demonstrate metallic/conductive behavior. Further, conductive channel regions made of 2-D materials can be turned on or off by applying suitable voltages on the gate electrode layer.

The compact vertical structures made from thin layered 2-D materials allow for further reduction in device dimension without sacrificing device performance and in turn results in higher packing density. For example, channel regions using 2-D materials (e.g., one molecule thick graphene layer) can be thin such as, for example, 0.34 nm. Particularly, the implementation of suitable 2-D materials in 3-D device architectures can yield further scaled, high-performance low-power devices.

In some embodiments, a semiconductor structure includes a substrate. The substrate includes first and second fins. The first and second fins can be separated by an inner gate electrode region. The semiconductor structure can also include a first gate stack with a first two dimensional (2-D) material layer extending continuously from a first sidewall of the first fin to a first sidewall of the second fin. The semiconductor structure also includes a second gate stack that has a second 2-D material layer extending continuously from a second sidewall of the first fin to a second sidewall of the second fin.

In some embodiments, a method of fabricating a semiconductor structure includes providing a substrate having a fin. The fin includes first and second sidewalls. First and second two-dimensional (2-D) material layers can be deposited on the first and second sidewalls, respectively. A first gate insulator layer and a first gate electrode can be deposited over the first and second 2 D material layers. A recess is formed in the fin between the first and second 2-D material layers. A second gate insulator layer and a second gate electrode layer are formed in the recess between the first and second 2-D material layers.

In some embodiments, a semiconductor structure includes a substrate. The semiconductor substrate includes a fin, where the fin can include opposing sidewalls and a top surface. A two-dimensional (2-D) material layer is formed over the opposing sidewalls and the top surface of the fin. A first dielectric layer can be formed over the 2-D material layer and a gate electrode can be formed over a portion of the first dielectric layer. Source and drain terminals can be formed over the 2-D material layer, where the source and drain terminals are on opposing sides of the gate electrode.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The foregoing disclosure outlines features of several embodiments so that a person of ordinary skill in the art may better understand the aspects of the present disclosure. A person of ordinary skill in the art will appreciate that they may readily use the present disclosure as a basis for designing or modifying other processes and structures for carrying out the same purposes and/or achieving the same advantages of the embodiments introduced herein. A person of ordinary skill in the art will also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor structure, comprising:

providing a substrate with a fin thereon, wherein the fin comprises first and second sidewalls and a top surface;

depositing a first dielectric layer on the fin, wherein the first dielectric layer covers the first and second sidewalls and the top surface of the fin;

depositing a two-dimensional (2-D) material layer on the first dielectric layer;

depositing a second dielectric layer on the 2-D material layer;

depositing an electrode layer on the second dielectric layer; and patterning the electrode layer and the second dielectric layer to form a gate stack having a length shorter than that of the 2-D material layer.

2. The method of claim 1, wherein patterning the electrode layer and the second dielectric layer comprises etching the electrode layer and the second dielectric layer to expose a portion of the 2-D material layer over the first and second sidewalls and the top surface of the fin.

3. The method of claim 1, further comprising:

forming a source terminal and a drain terminal on the fin, wherein the 2-D material layer over the first and second sidewalls and the top surface of the fin is between the source and drain terminals.

4. The method of claim 3, wherein each of the source and the drain terminals comprises at least one of platinum, nickel, cobalt; tantalum; titanium; platinum, erbium, palladium, aluminum, and tungsten.

5. The method of claim 1, wherein the 2-D material layer comprises graphene, a transition metal dichalcogenide (TMD) material, or phosphorene.

6. The method of claim 1, wherein depositing the 2-D material layer comprises epitaxially growing the 2-D material layer on a seed layer disposed on the first dielectric layer.

7. The method of claim 1, wherein depositing the 2-D material layer comprises growing the 2-D material layer on a liner layer disposed on the first dielectric layer.

8. The method of claim 1; wherein depositing the 2-D material layer comprises depositing the 2-D material layer with an aqueous solution of graphene oxide.

9. A semiconductor structure, comprising:

a substrate comprising a fin, wherein the fin comprises sidewalls and a top surface;

an insulating region disposed on the substrate and covering a bottom portion of the sidewalls of the fin;

a dielectric layer disposed on the top surface of the fin and on the sidewalls of the fin not covered by the insulating region;

a two-dimensional (2-D) material layer disposed on the dielectric layer, wherein the 2-D material layer extends over the insulating region; and a gate stack disposed on a portion of the 2-D material layer over the top surface and sidewalls of the fin.

10. The semiconductor structure of claim 9, wherein the gate stack is disposed on an other portion of the 2-D material layer over the insulating region.

11. The semiconductor structure of claim 9, wherein the gate stack comprises an other dielectric layer and a gate electrode.

12. The semiconductor structure of claim 9, further comprising a source terminal and a drain terminal disposed on the fin, wherein the source and drain terminals are on opposite sides of the gate stack.

13. The semiconductor structure of claim 9, wherein the 2-D material layer has a thickness between about 0.5 nm and about 10 nm.

14. A semiconductor structure, comprising:

a substrate comprising first and second fins separated by an inner gate region comprising a first gate electrode;

a first two dimensional (2-D) material layer extending between a first sidewall of the first fin and a first sidewall of the second fin;

a second 2-D material layer extending between a second sidewall of the first fin and a second sidewall of the second fin, wherein the inner gate region is disposed between the first and second 2-D material layers;

a first outer gate region disposed on a portion of the first 2-D material layer opposite from the inner gate region, wherein the first outer gate region comprises the first gate electrode and a second gate electrode; and a second outer gate region disposed on a portion of the second 2-D material layer opposite to the inner gate region, wherein the second gate region comprises the first electrode and the second gate electrode.

15. The semiconductor structure of claim 14, wherein the inner gate region comprises the first gate electrode disposed between a first inner dielectric layer and a second inner dielectric layer.

16. The semiconductor structure of claim 15, wherein the first inner dielectric layer is on the first 2-D material layer between the first and second fins and the second inner dielectric layer is on the second 2-D material layer between the first and second fins.

17. The semiconductor structure of claim 14, wherein the inner gate region is shorter than the first and second outer gate regions.

18. The semiconductor structure of claim 14, wherein the first outer gate region comprises a first outer dielectric layer on a portion of the first 2-D material layer.

19. The semiconductor structure of claim 14, wherein the second outer gate region comprises a second outer dielectric layer on a portion of the second 2-D material layer.

20. The semiconductor structure of claim 14, wherein the first and second gate electrodes comprise a same material and the inner gate region is shorter than the first and second outer gate regions.

* * * * *